(12) United States Patent
Pan et al.

(10) Patent No.: US 7,795,064 B2
(45) Date of Patent: Sep. 14, 2010

(54) FRONT-ILLUMINATED AVALANCHE PHOTODIODE

(75) Inventors: Zhong Pan, San Jose, CA (US); Craig Ciesla, Mountain View, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 24 days.

(21) Appl. No.: 12/260,688

(22) Filed: Oct. 29, 2008

(65) Prior Publication Data

US 2009/0121305 A1    May 14, 2009

Related U.S. Application Data

(60) Provisional application No. 60/987,878, filed on Nov. 14, 2007.

(51) Int. Cl.
*H01L 21/00* (2006.01)

(52) U.S. Cl. .............................. 438/57; 438/29; 438/48; 438/65; 438/92; 438/118; 257/431; 257/432; 257/436; 257/461; 257/462; 257/E21.503; 257/E21.511

(58) Field of Classification Search .................... 438/92; 257/457
See application file for complete search history.

(56) References Cited

U.S. PATENT DOCUMENTS

| | | | | |
|---|---|---|---|---|
| 5,179,430 A | 1/1993 | Torikai | ....................... | 257/186 |
| 5,250,466 A | 10/1993 | Gerner et al. | ................ | 438/605 |
| 5,610,416 A | 3/1997 | Su et al. | ...................... | 257/186 |
| 5,880,489 A | 3/1999 | Funaba et al. | ................ | 257/184 |
| 5,942,771 A | 8/1999 | Ishimura | ..................... | 257/184 |
| 6,384,462 B1 | 5/2002 | Pauchard et al. | ............. | 257/461 |
| 6,515,315 B1 | 2/2003 | Itzler et al. | ................... | 257/186 |
| 6,693,337 B2 | 2/2004 | Yoneda et al. | ............... | 257/436 |
| 6,831,265 B2 | 12/2004 | Yoneda et al. | ........... | 250/214 R |
| 6,894,322 B2 | 5/2005 | Kwan et al. | .................. | 257/186 |
| 7,038,251 B2 | 5/2006 | Ishimura et al. | ............. | 257/186 |
| 7,259,408 B2 | 8/2007 | Yagyu et al. | ................. | 257/186 |
| 2003/0164444 A1* | 9/2003 | Yoneda et al. | ........... | 250/214.1 |
| 2008/0121867 A1 | 5/2008 | Yagyu et al. | ................... | 257/21 |

OTHER PUBLICATIONS

Yagyu et al., "Simple Planar Structure for High-Performance AlInAs Avalanche Photodiodes", IEEE Photonics Technology Letters, vol. 18, pp. 76-78, 2006.
Ishimura, et al., "High Efficiency 10 Gbps InP/InGaAs Avalanche Photodiodes with Distributed Bragg Reflector", Proceedings of the 27th European Conference on Optical Communication (ECOC '01) vol. 4, pp. 554-555, 2001.

* cited by examiner

*Primary Examiner*—N Drew Richards
*Assistant Examiner*—Kyoung Lee
(74) *Attorney, Agent, or Firm*—Matthew A. Pequignot; Pequignot + Myers LLC

(57) ABSTRACT

The present invention provides a front-illuminated avalanche photodiode (APD) with improved intrinsic responsivity, as well as a method of fabricating such a front-illuminated APD. The front-illuminated APD comprises an APD body of semiconductor material, which includes a substrate and a layer stack disposed on a front surface of the substrate. The layer stack includes an absorption layer, a multiplication layer, and a field-control layer. Advantageously, a back surface of the APD body is mechanically and chemically polished, and a reflector having a reflectance of greater than 90% at the absorption wavelength band is disposed on the back surface of the APD body. Thus, incident light that is not absorbed in a first pass through the absorption layer is reflected by the reflector for a second pass through the absorption layer, increasing the intrinsic responsivity of the front-illuminated APD.

25 Claims, 12 Drawing Sheets

FRONT-ILLUMINATED AVALANCHE PHOTODIODE

CROSS-REFERENCE TO RELATED APPLICATIONS

The present invention claims priority from U.S. Patent Application No. 60/987,878 filed Nov. 14, 2007, which is incorporated herein by reference.

TECHNICAL FIELD

The present invention relates to avalanche photodiodes (APDs) and, in particular, to front-illuminated APDs.

BACKGROUND OF THE INVENTION

In optical communication systems, avalanche photodiodes (APDs) are used to convert optical signals into electrical signals. APDs having a planar configuration are among the most reliable. With reference to FIGS. 1 and 2, a typical planar APD comprises an APD body 101 or 201 of semiconductor material, as disclosed in U.S. Pat. No. 6,515,315 to Itzler, et al., issued on Feb. 4, 2003; and in U.S. Patent Application Publication No. 2008/0121867 to Yagyu, et al., published on May 29, 2008; respectively, which are incorporated herein by reference.

The APD body 101 or 201 includes a substrate 110 or 210 and a layer stack 120 or 220, disposed on a front surface of the substrate 110 or 210. The layer stack 120 or 220 comprises an absorption layer 121 or 221 of thickness $W_a$, for absorbing light at an absorption wavelength band to generate a photocurrent, a multiplication layer 122 or 222, which includes a multiplication region of thickness $W_m$, for multiplying the photocurrent through avalanche multiplication, and a field-control layer 123 or 223, for controlling electric fields in the absorption layer 121 or 221 and the multiplication layer 122 or 222.

In the APD body 101, the multiplication layer 122 includes a diffusion region 124, for defining the multiplication region and for providing a p-n junction. The layer stack 120 further comprises a buffer layer 125, for accommodating lattice mismatch between the substrate 110 and the layer stack 120, and a grading layer 126, for facilitating current flow between the absorption layer 121 and the multiplication layer 122.

In the APD body 201, the layer stack 220 further comprises a buffer layer 225, for accommodating lattice mismatch between the substrate 210 and the layer stack 220, and a window layer 227, for transmitting light at the absorption wavelength band to the absorption layer 221. The window layer 227 and the absorption layer 221 include a diffusion region 224, for defining the multiplication region and for providing a p-n junction.

The APD body 101 or 201 may be included in an APD having a front-illuminated or a back-illuminated configuration. In either configuration, the thickness of the absorption layer 121 or 221 plays an important role in determining many characteristics of the APD, such as the breakdown voltage, the process window of the thickness of the multiplication region, and the intrinsic responsivity.

The breakdown voltage of the APD decreases linearly with decreasing thickness of the absorption layer 121 or 221. Thus, from an operational point of view, the thickness of the absorption layer 121 or 221 should be minimized to minimize the breakdown voltage, as a lower breakdown voltage allows the APD to be operated at a lower voltage.

The process window, i.e. the allowable range, of the thickness of the multiplication region in the APD increases with decreasing thickness of the absorption layer 121 or 221. Thus, from a manufacturing point of view, the thickness of the absorption layer 121 or 221 should be minimized to maximize the process window of the thickness of the multiplication region, as a larger allowable range of the thickness of the multiplication region can improve the manufacturing yield of the APD.

However, the intrinsic responsivity, i.e. the responsivity at a photocurrent gain of 1, of the APD decreases with decreasing thickness of the absorption layer 121 or 221. Thus, from a performance point of view, the thickness of the absorption layer 121 or 221 should be maximized to maximize the intrinsic responsivity, as a higher intrinsic responsivity can increase the sensitivity of the APD.

One approach to increasing the intrinsic responsivity of the APD, without increasing the breakdown voltage or decreasing the process window of the thickness of the multiplication region, is to increase the effective thickness of the absorption layer 121 or 221 by including a reflector in the APD.

For example, front-illuminated APDs including a layer stack comprising a distributed Bragg reflector (DBR) of semiconductor material have been disclosed in an article entitled "Simple Planar Structure for High-Performance AllnAs Avalanche Photodiodes" by Yagyu, et al. (IEEE Photonics Technology Letters, 2006, Vol. 18, pp. 76-78); in an article entitled "High Efficiency 10 Gbps InP/InGaAs Avalanche Photodiodes with Distributed Bragg Reflector" by Ishimura, et al. (Proceedings of the 27th European Conference on Optical Communication (ECOC '01), 2001, Vol. 4, pp. 554-555); in U.S. Pat. No. 7,259,408 to Yagyu, et al., issued on Aug. 21, 2007; in U.S. Pat. No. 7,038,251 to Ishimura, et al., issued on May 2, 2006; and in U.S. Pat. No. 5,880,489 to Funaba, et al., issued on Mar. 9, 1999.

In such front-illuminated APDs, light incident on a front surface of an APD body passes through a front portion of the layer stack to an absorption layer, where a portion of the incident light is absorbed. An unabsorbed portion of the incident light passes through a back portion of the layer stack to the DBR, where it is reflected back for a second pass through the absorption layer, increasing the effective thickness of the absorption layer and the intrinsic responsivity of the front-illuminated APDs. However, the formation of a DBR of semiconductor material with a high reflectivity is challenging and adds complexity to the manufacturing process of the front-illuminated APDs. Furthermore, the DBR has a high reflectivity at only a narrow wavelength band.

To attempt to overcome such limitations, a reflector has been included on a front surface of an APD body in back-illuminated APDs, as disclosed in U.S. Pat. No. 6,894,322 to Kwan, et al., issued on May 17, 2005; in U.S. Pat. No. 6,831,265 to Yoneda, et al., issued on Dec. 14, 2004; in U.S. Pat. No. 6,693,337 to Yoneda, et al., issued on Feb. 17, 2004; in U.S. Pat. No. 5,610,416 to Su, et al., issued on Mar. 11, 1997; and in U.S. Pat. No. 5,179,430 to Torikai, issued on Jan. 12, 1993; for example.

In such back-illuminated APDs, light incident on a back surface of the APD body passes through a substrate and a back portion of a layer stack to an absorption layer, where a portion of the incident light is absorbed. An unabsorbed portion of the incident light passes through a front portion of the layer stack to the reflector on the front surface of the APD body, where it is reflected back for a second pass through the absorption layer, increasing the effective thickness of the absorption layer and the intrinsic responsivity of the back-illuminated APDs. However, the manufacturing yield of back-illuminated APDs is relatively low, because, typically, many process steps are carried out on the back side of the APD body after the substrate is thinned by lapping. Furthermore, the package-assembly cost of back-illuminated APDs is relatively high, because the chips must, typically, be flipped to allow back illumination.

Similarly, a reflector has been included on a back or a front surface of a positive-intrinsic-negative (PIN) photodiode body in front-illuminated and back-illuminated PIN photodiodes, respectively, as disclosed in U.S. Pat. No. 6,831,265; in U.S. Pat. No. 6,693,337; and in U.S. Pat. No. 5,942,771 to Ishimura, issued on Aug. 24, 1999; for example.

The present invention provides front-illuminated APDs with improved intrinsic responsivity, which comprise an APD body having a layer structure similar to that of the prior-art APD body 101 or 201, but which have configurations and features distinct from those of prior-art photodiodes. Advantageously, a back surface of the APD body is mechanically and chemically polished to increase a reflectance of the back surface of the APD body at an absorption wavelength band. In addition, a reflector having a reflectance of greater than 90% at the absorption wavelength band is disposed on the back surface of the APD body.

Light incident on a front surface of the APD body passes through a front portion of a layer stack to an absorption layer, where a portion of the incident light is absorbed. An unabsorbed portion of the incident light passes through a back portion of the layer stack and, in some instances, a substrate to the reflector on the back surface of the APD body, where it is reflected back for a second pass through the absorption layer, increasing the effective thickness of the absorption layer and the intrinsic responsivity of the front-illuminated APDs.

SUMMARY OF THE INVENTION

Accordingly, the present invention relates to a front-illuminated avalanche photodiode (APD) comprising: an APD body of semiconductor material, including: a substrate; and a layer stack, disposed on a front surface of the substrate, comprising: an absorption layer for absorbing light at an absorption wavelength band to generate a photocurrent; a multiplication layer, including a multiplication region, for multiplying the photocurrent through avalanche multiplication; and a field-control layer for controlling electric fields in the absorption layer and the multiplication layer; wherein a back surface of the APD body is mechanically and chemically polished; and a reflector having a reflectance of greater than 90% at the absorption wavelength band, for reflecting light at the absorption wavelength band toward the absorption layer, disposed on the back surface of the APD body.

Another aspect of the present invention relates to a method of fabricating a front-illuminated APD, comprising: i) forming an APD body of semiconductor material, including: a) providing a substrate; and b) epitaxially growing a layer stack on a front surface of the substrate, comprising: epitaxially growing an absorption layer, for absorbing light at an absorption wavelength band to generate a photocurrent; epitaxially growing a multiplication layer, including a multiplication region, for multiplying the photocurrent through avalanche multiplication; and epitaxially growing a field-control layer for controlling electric fields in the absorption layer and the multiplication layer; ii) mechanically and chemically polishing a back surface of the APD body; and iii) depositing a reflector having a reflectance of greater than 90% at the absorption wavelength band on the back surface of the APD body.

BRIEF DESCRIPTION OF THE DRAWINGS

The invention will be described in greater detail with reference to the accompanying drawings, wherein.

DETAILED DESCRIPTION

The present invention provides front-illuminated avalanche photodiodes (APDs) with improved intrinsic responsivity. The advantageous features of the front-illuminated APDs provided by the present invention will be described in detail in the context of exemplary, preferred embodiments of a front-illuminated APD. However, those skilled in the art will appreciate that these advantageous features could also be applied to front-illuminated APDs having other configurations or layer structures.

Figure 1:
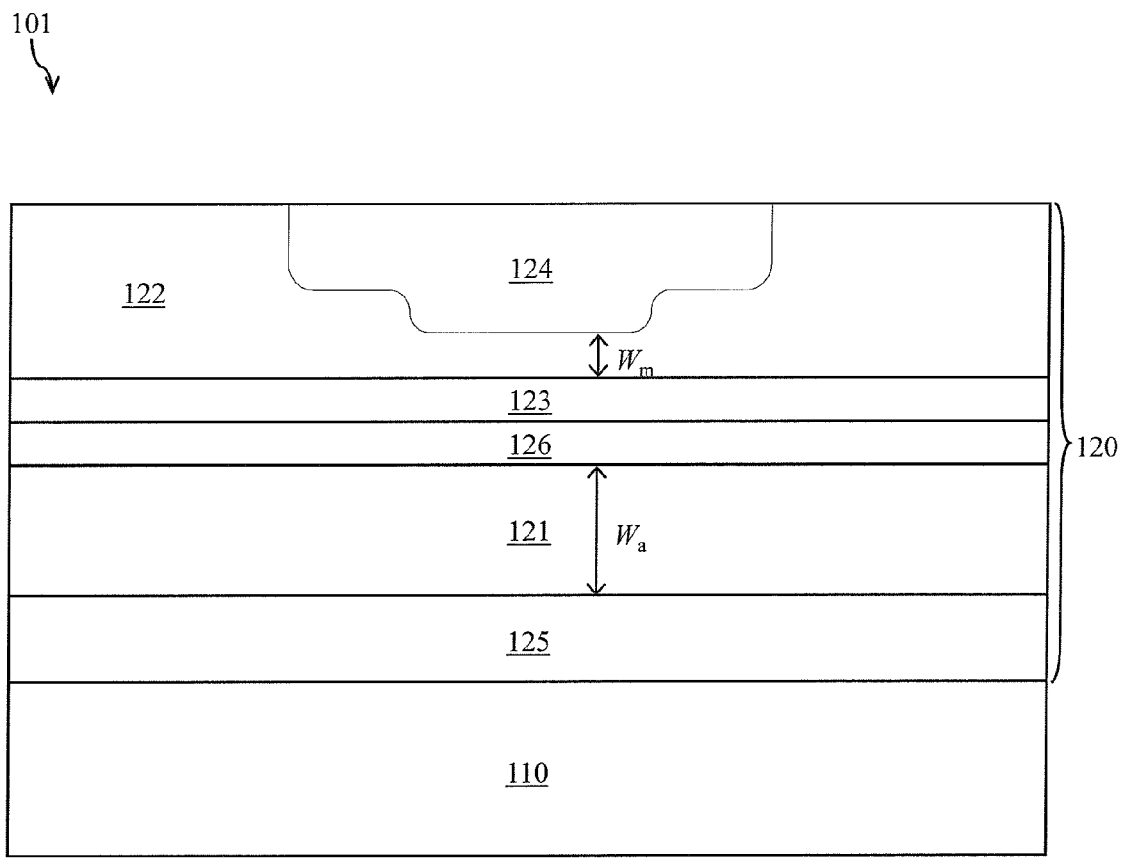
FIG. 1 is a schematic illustration of a cross-section of a first prior-art avalanche photodetector (APD) body.
Figure 2:
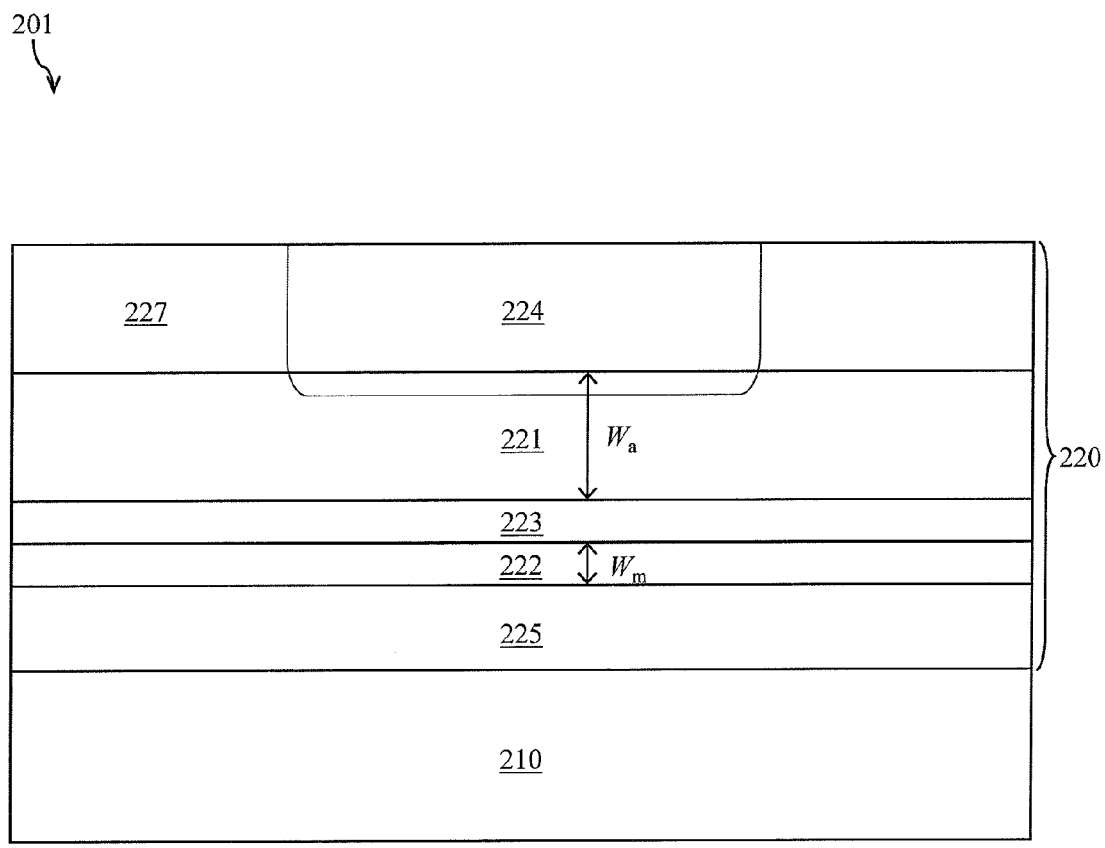
FIG. 2 is a schematic illustration of a cross-section of a second prior-art APD body.
Figure 3:
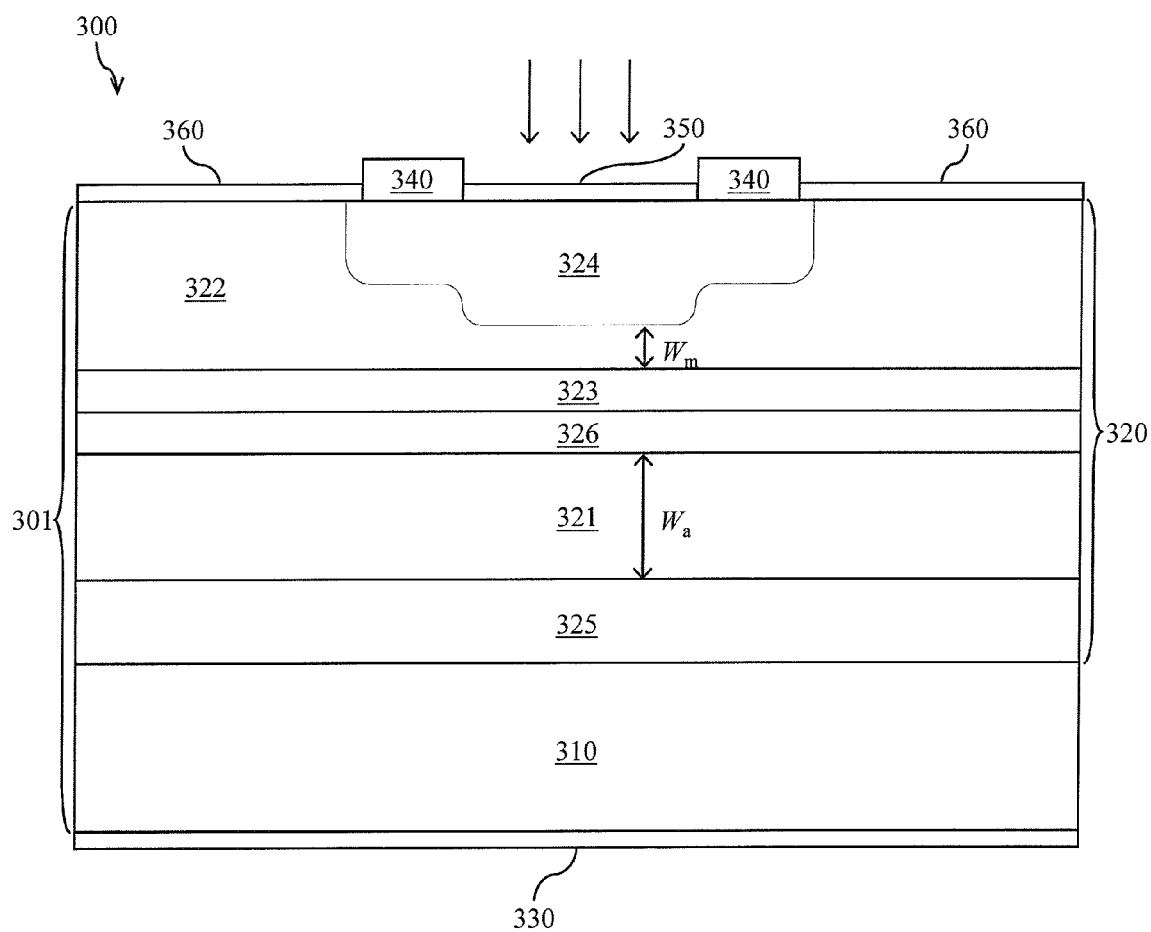
FIG. 3 is a schematic illustration of a cross-section of a first embodiment of a front-illuminated APD according to the present invention.

With reference to FIG. 3, a first embodiment of a front-illuminated APD 300 includes an APD body 301 of semiconductor material, which has a layer structure similar to that of the prior-art APD body 101. The APD body 301 includes a substrate 310 and a layer stack 320. Advantageously, a back surface of the APD body 301 is mechanically and chemically polished to increase a reflectance of the back surface of the APD body 301 at an absorption wavelength band.

The layer stack 320 comprises an absorption layer 321, for absorbing light at the absorption wavelength band to generate a photocurrent, a multiplication layer 322, which includes a multiplication region, for multiplying the photocurrent through avalanche multiplication, and a field-control layer 323, for controlling electric fields in the absorption layer 321 and the multiplication layer 322. The multiplication layer 322 includes a diffusion region 324, for defining the multiplication region and for providing a p-n junction. In some instances, the multiplication layer 322 also includes a guard ring (not illustrated in FIG. 3), for controlling electric fields at a surface of the multiplication layer 322. The layer stack 320 further comprises a buffer layer 325, for accommodating lattice mismatch between the substrate 310 and the layer stack 320, and a grading layer 326, for facilitating current flow between the absorption layer 321 and the multiplication layer 322.

The layer stack 320 is disposed on a front surface of the substrate 310. Within the layer stack 320, the buffer layer 325 is disposed at a back of the layer stack 320, and the absorption layer 321 is disposed on a front surface of the buffer layer 325. The grading layer 326 is disposed on a front surface of the absorption layer 321, and the field-control layer 323 is disposed on a front surface of the grading layer 326. The multiplication layer 322 is disposed on a front surface of the field-control layer 323 at a front of the layer stack 320, and the diffusion region 324 is disposed in a front portion of the multiplication layer 322. Preferably, the diffusion region 324 has a shaped profile, as illustrated in FIG. 3 and disclosed in U.S. Pat. No. 6,515,315.

In addition, the front-illuminated APD 300 includes a reflector 330 having a reflectance of greater than 90% at the absorption wavelength band, for reflecting light at the absorption wavelength band toward the absorption layer 321. The reflector 330 also serves as a back contact, for passing current to or from the front-illuminated APD 300. The front-illuminated APD 300 further includes a front contact 340 of metallic material, for passing current from or to the front-illuminated APD 300, an antireflection layer 350 of dielectric material, for enhancing transmission of light at the absorption wavelength band, and a passivation layer 360 of dielectric material, for passivating a front surface of the APD body 301.

The reflector 330 is disposed on the back surface of the APD body 301. Preferably, the reflector 330 is disposed on the entire back surface of the APD body 301. The front contact 340 is annular and is disposed on an annular contact region of the front surface of the APD body 301, such that an inner circumference of the front contact 340 defines a circular window region of the front surface of the APD body 301. The antireflection layer 350 is disposed on the window region of the front surface of the APD body 301, and the passivation layer 360 is disposed on the front surface of the APD body 301 with exception of the contact region and the window region.

In the front-illuminated APD 300, the substrate 310 is of extrinsic semiconductor material of a first conductivity type, i.e. n-type or p-type. Preferably, the substrate 310 is of an n-type or a p-type III-V semiconductor compound. An n-type III-V semiconductor compound, typically, includes a donor dopant of Group VI, such as sulfur, selenium, or tellurium, or of Group IV, such as carbon, silicon, or germanium. A p-type III-V semiconductor compound, typically, includes an acceptor dopant of Group II, such as beryllium, zinc, or cadmium, or of Group IV, such as carbon, silicon, or germanium. More preferably, the substrate 310 is of a heavily doped $n^+$-type or $p^+$-type III-V semiconductor compound. In a preferred embodiment, the substrate 310 is of $n^+$-type InP.

The absorption layer 321 is of intrinsic, i.e. not intentionally doped, semiconductor material, which is, preferably, lattice-matched to the semiconductor material of the substrate 310. The semiconductor material of the absorption layer 321 is selected to have a band-gap energy corresponding to a wavelength larger than that of light to be detected. Preferably, the absorption layer 321 is of an intrinsic III-V semiconductor compound. In a preferred embodiment, the absorption layer 321 is of intrinsic $In_{1-x}Ga_xAs$, hereafter referred to as InGaAs, lattice-matched to InP. InP-lattice-matched InGaAs, which has a composition of $In_{0.53}Ga_{0.47}As$, has a band-gap energy of about 0.74 eV at room temperature and, thus, absorbs light at a wavelength of less than about 1.7 μm. Preferably, the absorption layer 321 has a thickness $W_a$ of less than 1 μm.

The multiplication layer 322 is of intrinsic semiconductor material, which is, preferably, lattice-matched to the semiconductor material of the substrate 310. The multiplication layer 322 is, preferably, of an intrinsic III-V semiconductor compound. In a preferred embodiment, the multiplication layer 322 is of intrinsic InP.

The multiplication region of the multiplication layer 322, which is defined by the diffusion region 324, has a thickness $W_m$. Advantageously, the process window of the thickness of the multiplication region is relatively large, improving the manufacturing yield of the front-illuminated APD 300.

The field-control layer 323 is of extrinsic semiconductor material of the first conductivity type, which is, preferably, lattice-matched to the semiconductor material of the substrate 310. The field-control layer 323 is, preferably, of an n-type or a p-type III-V semiconductor compound. In a preferred embodiment, the field-control layer 323 is of n-type InP.

The diffusion region 324 of the multiplication layer 322 is diffused with a dopant, such that the diffusion region 324 is of extrinsic semiconductor material of a second conductivity type, i.e. p-type or n-type. Preferably, the diffusion region 324 is diffused with an acceptor dopant or a donor dopant, such that the diffusion region 324 is of a p-type or an n-type III-V semiconductor compound, respectively. More preferably, the diffusion region 324 is of a heavily doped $p^+$-type or $n^+$-type III-V semiconductor compound. In a preferred embodiment, the diffusion region 324 is diffused with zinc, such that the diffusion region 324 is of $p^+$-type InP.

The buffer layer 325 is of extrinsic semiconductor material of the first conductivity type, which is, preferably, lattice-matched to the semiconductor material of the substrate 310. The buffer layer 325 is, preferably, of an n-type or a p-type III-V semiconductor compound. In a preferred embodiment, the buffer layer 325 is of n-type InP.

The grading layer 326 is of extrinsic semiconductor material of the first conductivity type, which is, preferably, lattice-matched to the semiconductor material of the substrate 310. To facilitate current flow between the absorption layer 321 and the multiplication layer 322, the semiconductor material of the grading layer 326 is selected to have a band-gap energy larger than that of the semiconductor material of the absorption layer 321 and smaller than that of the semiconductor material of the multiplication layer 322. The grading layer 326 is, typically, compositionally graded. Preferably, the grading layer 326 is of an n-type or a p-type III-V semiconductor compound. In a preferred embodiment, the grading layer 326 is of n-type $In_{1-x}Ga_xAs_yP_{1-y}$, hereafter referred to as InGaAsP, lattice-matched to InP. The compositional range of InP-lattice-matched InGaAsP is $In_{1-x}Ga_xAs_yP_{1-y}$ with $0 \leq x \leq 0.47$ and $0 \leq y \leq 1$. Thus, a compositional range of InP-lattice-matched InGaAsP having an appropriate band-gap energy range, between about 0.74 eV and about 1.35 eV at room temperature, is selected for the grading layer 326.

The reflector 330 is, typically, of metallic material. Preferably, the reflector 330 is of one or more metals or metal alloys suitable for ohmic contacting to the APD body 301, as well as for reflecting light at the absorption wavelength band. More preferably, the reflector 330 includes a layer of a noble metal, such as copper, silver, or gold, or a layer of an alloy including a noble metal, which serves as a reflecting layer. In some instances, the reflector 330 also includes a wetting layer and/ or a diffusion-barrier layer. In a preferred embodiment, the reflector 330 is of non-alloyed metallic material and includes a layer of titanium, which serves as the wetting layer, a layer of platinum, which serves as the diffusion-barrier layer, and a layer of gold, which serves as the reflecting layer. In another preferred embodiment, the reflector 330 is of alloyed metallic material and includes a layer of a gold—germanium alloy having a germanium concentration of less than 1% by weight, which serves as the reflecting layer.

In some instances, the reflector 330 is of metallic material and dielectric material, or of metallic material, dielectric material, and semiconductor material. In such instances, the reflector 330, preferably, includes a layer of a noble metal or a layer of an alloy including a noble metal, as described heretofore, as well as one or more layers of dielectric compounds, as described hereafter, disposed on a back surface of the layer of a noble metal or the layer of an alloy including a noble metal.

The front contact 340 is, preferably, of one or more metals or metal alloys suitable for ohmic contacting to the APD body 301. In a preferred embodiment, the front contact 340 is of a eutectic gold—germanium alloy having a germanium concentration of 12% by weight.

The antireflection layer 350 is, preferably, of a dielectric compound, such as $SiN_x$, $SiO_xN_y$, or $SiO_2$. Preferably, the antireflection layer 350 has a thickness corresponding to an optical path length of approximately one quarter of the midpoint of the absorption wavelength band. In a preferred embodiment, the antireflection layer 350 is of $SiN_x$.

Likewise, the passivation layer 360 is, preferably, of a dielectric compound, such as $SiN_x$, $SiO_xN_y$, or $SiO_2$. In a preferred embodiment, the passivation layer 360 is of $SiN_x$.

Figure 4:
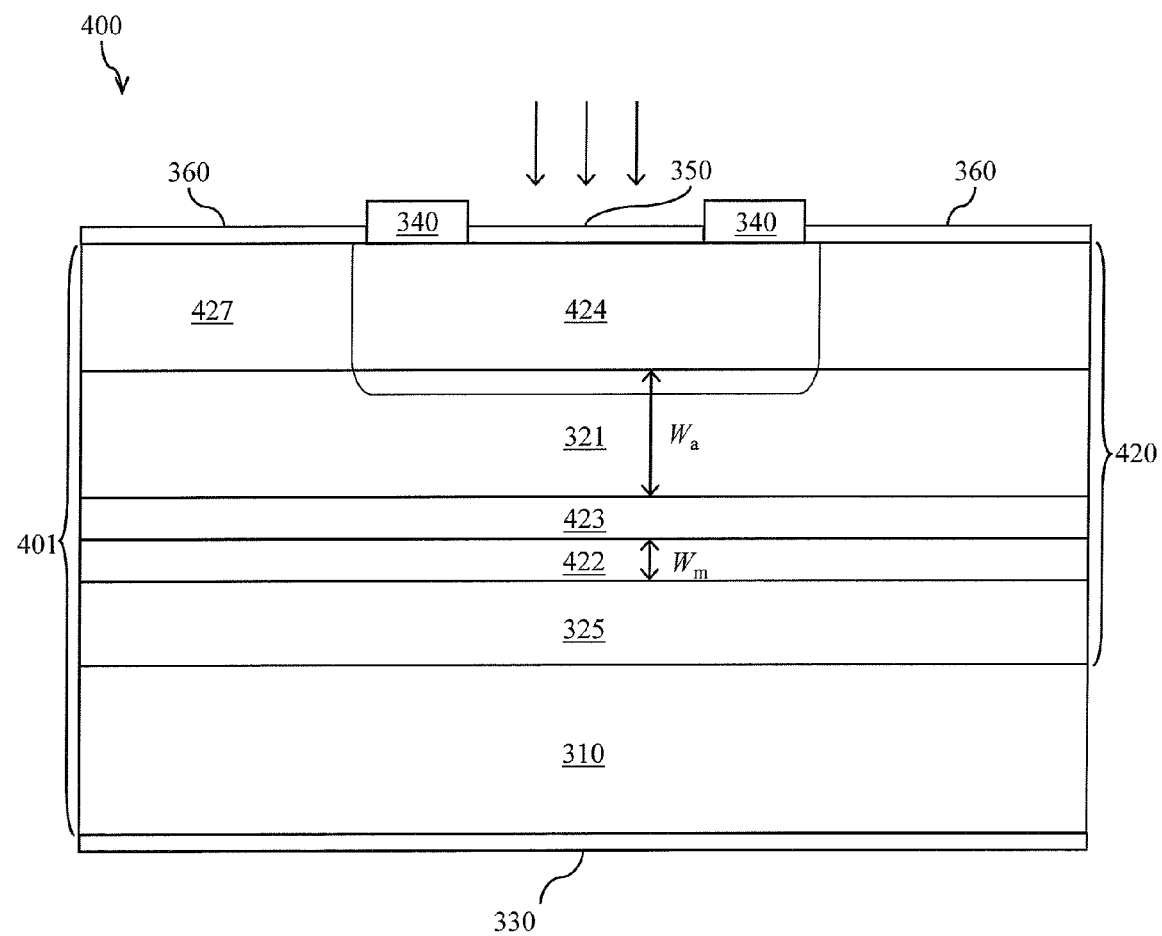
FIG. 4 is a schematic illustration of a cross-section of a second embodiment of a front-illuminated APD according to the present invention.

With reference to FIG. 4, a second embodiment of a front-illuminated APD 400 includes an APD body 401, which has a layer structure similar to that of the prior-art APD body 201. The APD body 401 includes the substrate 310 of the front-illuminated APD 300, as well as a layer stack 420. Advantageously, a back surface of the APD body 401 is mechanically and chemically polished to increase a reflectance of the back surface of the APD body 401 at the absorption wavelength band.

The layer stack 420 comprises the absorption layer 321 and the buffer layer 325 of the front-illuminated APD 300. The layer stack 420 further comprises a multiplication layer 422, which includes a multiplication region, for multiplying the photocurrent through avalanche multiplication, a field-control layer 423, for controlling electric fields in the absorption layer 321 and the multiplication layer 422, and a window layer 427, for transmitting light at the absorption wavelength band to the absorption layer 321. The window layer 427 and the absorption layer 321 include a diffusion region 424, for defining the multiplication region and for providing a p-n junction.

The layer stack 420 is disposed on the front surface of the substrate 310. Within the layer stack 420, the buffer layer 325 is disposed at a back of the layer stack 420, and the multiplication layer 422 is disposed on the front surface of the buffer layer 325. The field-control layer 423 is disposed on a front surface of the multiplication layer 422, and the absorption layer 321 is disposed on a front surface of the field-control layer 423. The window layer 427 is disposed on the front surface of the absorption layer 321 at a front of the layer stack 420, and the diffusion region 424 is disposed in the window layer 427 and in a front portion of the absorption layer 321. Preferably, the diffusion region 424 penetrates into the absorption layer 321 by about 0.2 μm. Thus, the p-n junction is located in the absorption layer 321, preventing carrier pile-up at the interface between the absorption layer 321 and the window layer 427.

In addition, the front-illuminated APD 400 includes the reflector 330, the front contact 340, the antireflection layer 350, and the passivation layer 360 of the front-illuminated APD 300.

The reflector 330 is disposed on the back surface of the APD body 401. Preferably, the reflector 330 is disposed on the entire back surface of the APD body 401. The front contact 340 is disposed on an annular contact region of a front surface of the APD body 401, such that an inner circumference of the front contact 340 defines a circular window region of the front surface of the APD body 401. The antireflection layer 350 is disposed on the window region of the front surface of the APD body 401, and the passivation layer 360 is disposed on the front surface of the APD body 401 with exception of the contact region and the window region.

In the front-illuminated APD 400, the multiplication layer 422 is of intrinsic semiconductor material, which is, preferably, lattice-matched to the semiconductor material of the substrate 310. The multiplication layer 422 is, preferably, of an intrinsic III-V semiconductor compound. In a preferred embodiment, the multiplication layer 422 is of intrinsic $In_{1-x}Al_xAs$, hereafter referred to as InAlAs, lattice-matched to InP. The composition of InP-lattice-matched InAlAs is $In_{0.52}Al_{0.48}As$.

The field-control layer 423 is of extrinsic semiconductor material of the second conductivity type, which is, preferably, lattice-matched to the semiconductor material of the substrate 310. The field-control layer 423 is, preferably, of a p-type or an n-type III-V semiconductor compound. More preferably, the field-control layer 423 is of a heavily doped $p^+$-type or $n^+$-type III-V semiconductor compound. In a preferred embodiment, the field-control layer 423 is of $p^+$-type InAlAs, lattice-matched to InP.

The window layer 427 is of intrinsic semiconductor material, which is, preferably lattice-matched to the semiconductor material of the substrate 310. The semiconductor material of the window layer 427 is selected to have a band-gap energy corresponding to a wavelength smaller than that of light to be detected. Preferably, the window layer 427 is of an intrinsic III-V semiconductor compound. In a preferred embodiment, the window layer 427 is of intrinsic InP, which has a band-gap energy of about 1.35 eV at room temperature and, thus, transmits light at a wavelength of greater than about 0.92 μm. In another preferred embodiment, the window layer 427 is of intrinsic $In_{1-x-y}Ga_xAl_yAs$, hereafter referred to as InGaAlAs, lattice-matched to InP. The compositional range of InP-lattice-matched InGaAlAs is $In_{1-x-y}Ga_xAl_yAs$ with $0 \leq x \leq 0.47$ and $0 \leq y \leq 0.48$. Thus, a composition of InP-lattice-matched InGaAlAs having an appropriate band-gap energy, greater than about 0.74 eV at room temperature, is selected for the window layer 427.

The diffusion region 424 of the window layer 427 and the absorption layer 321 is diffused with a dopant, such that the diffusion region 424 is of extrinsic semiconductor material of the second conductivity type. Preferably, the diffusion region 424 is diffused with an acceptor dopant or a donor dopant, such that the diffusion region 424 is of a p-type or an n-type III-V semiconductor compound, respectively. In a preferred embodiment, the diffusion region 424 is diffused with zinc, such that the diffusion region 424 is of p-type InP. In another preferred embodiment, the diffusion region 424 is diffused with zinc, such that the diffusion region 424 is of p-type InGaAlAs, lattice-matched to InP.

Figure 5:
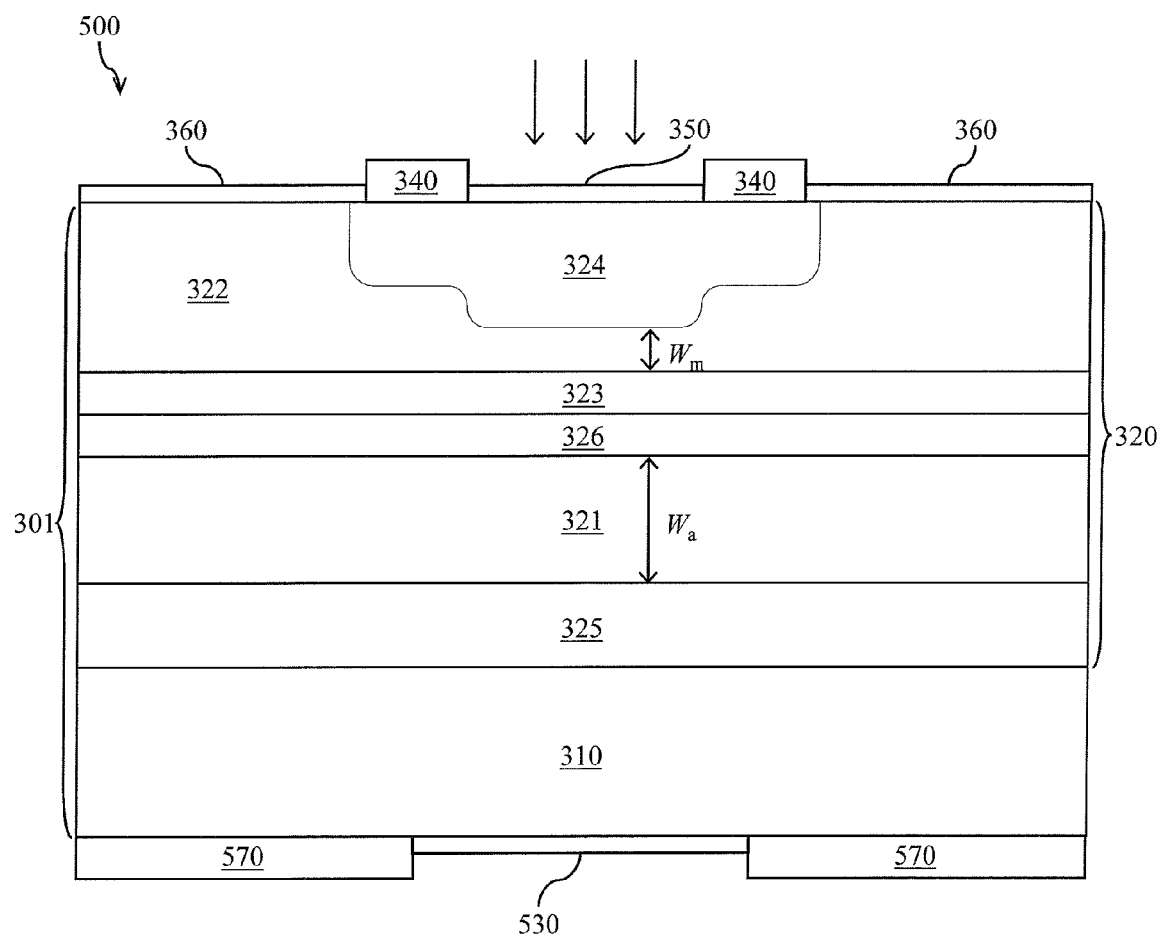
FIG. 5 is a schematic illustration of a cross-section of a third embodiment of a front-illuminated APD according to the present invention.

With reference to FIG. 5, a third embodiment of a front-illuminated APD 500 includes the APD body 301, the front contact 340, the antireflection layer 350, and the passivation layer 360 of the front-illuminated APD 300. In addition, the front-illuminated APD 500 includes a reflector 530 having a reflectance of greater than 90% at the absorption wavelength band, for reflecting light at the absorption wavelength band toward the absorption layer 321, as well as a back contact 570 of metallic material, for passing current to or from the front-illuminated APD 500.

The back contact 570 is annular and is disposed on an annular contact region of the back surface of the APD body 301, such that an inner circumference of the back contact 570 defines a circular reflector region of the back surface of the APD body 301. The reflector 530 is disposed on the reflector region of the back surface of the APD body 301. Preferably, the reflector 530 is disposed only on the reflector region of the back surface of the APD body 301.

In the front-illuminated APD 500, the reflector 530 is, typically, of dielectric material, or of dielectric material and semiconductor material. Preferably, the reflector 530 includes one or more layers of dielectric compounds, such as $SiN_x$, $SiO_xN_y$, $SiO_2$, $AlO_x$, and $TiO_2$. In some instances, the reflector 530 also includes a layer of an amorphous semiconductor, such as amorphous silicon. The one or more layers, preferably, each have a thickness corresponding to an optical path length of approximately one quarter of the midpoint of the absorption wavelength band. In preferred embodiments, the reflector 530 includes a layer of $SiN_x$ or $SiO_2$. In another preferred embodiment, the reflector 530 includes a stack of layers of $SiN_x$ and $AlO_x$. In yet another preferred embodiment, the reflector 530 includes a stack of layers of $SiN_x$, amorphous silicon, and $SiO_2$.

In some instances, the reflector 530 is of metallic material and dielectric material, or of metallic material, dielectric material, and semiconductor material. In such instances, the reflector 530 includes one or more layers of dielectric compounds, as described heretofore, as well as a layer of a noble metal or a layer of an alloy including a noble metal, as described heretofore, disposed on a back surface of the one or more layers of dielectric compounds.

The back contact 570 is, preferably, of one or more metals or metal alloys suitable for ohmic contacting to the APD body 301. In a preferred embodiment, the back contact 570 is of the eutectic gold-germanium alloy.

Figure 6:
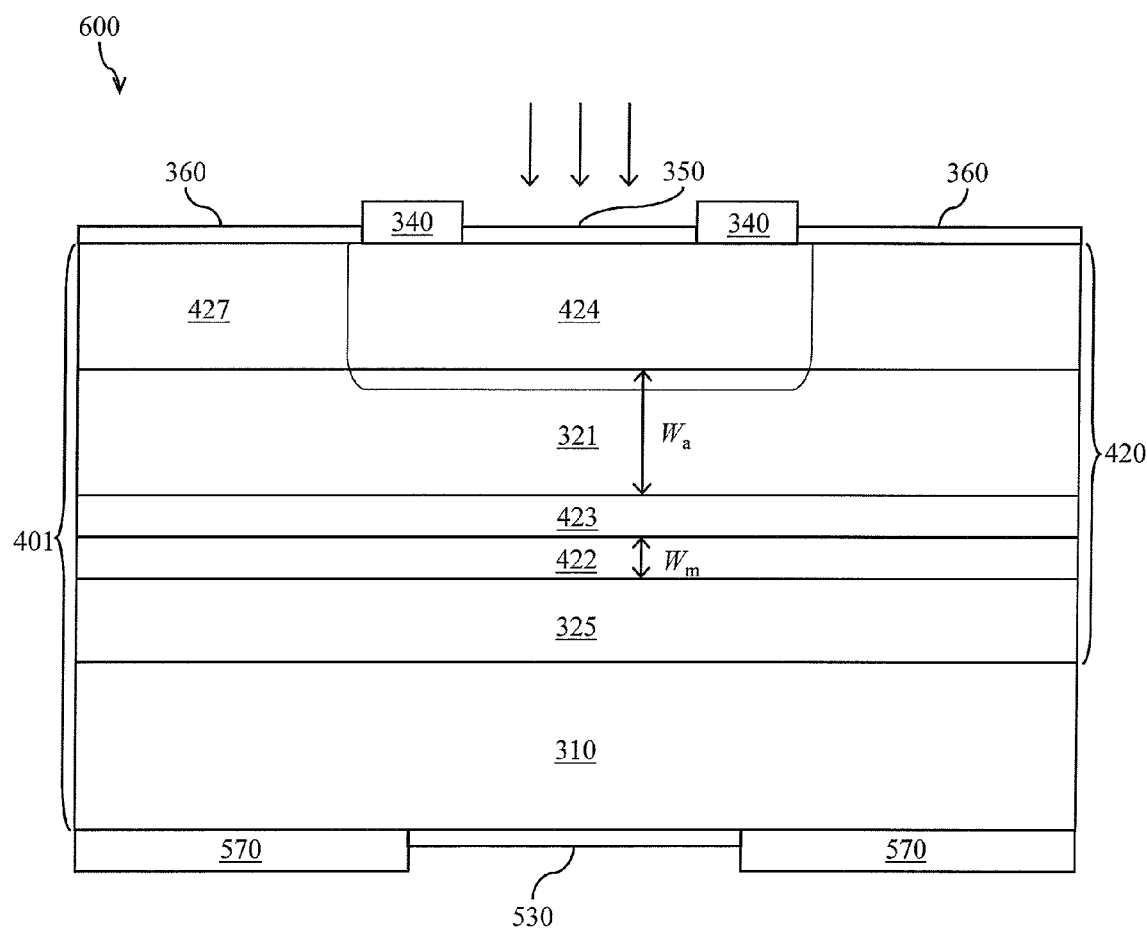
FIG. 6 is a schematic illustration of a cross-section of a fourth embodiment of a front-illuminated APD according to the present invention.

With reference to FIG. 6, a fourth embodiment of a front-illuminated APD 600 includes the APD body 401 of the front-illuminated APD 400, the front contact 340, the antireflection layer 350, and the passivation layer 360 of the front-illuminated APD 300, and the reflector 530 and back contact 570 of the front-illuminated APD 500.

The back contact 570 is disposed on an annular contact region of the back surface of the APD body 401, such that an inner circumference of the back contact 570 defines a circular reflector region of the back surface of the APD body 401. The reflector 530 is disposed on the reflector region of the back surface of the APD body 401. Preferably, the reflector 530 is disposed only on the reflector region of the back surface of the APD body 401.

Figure 7:
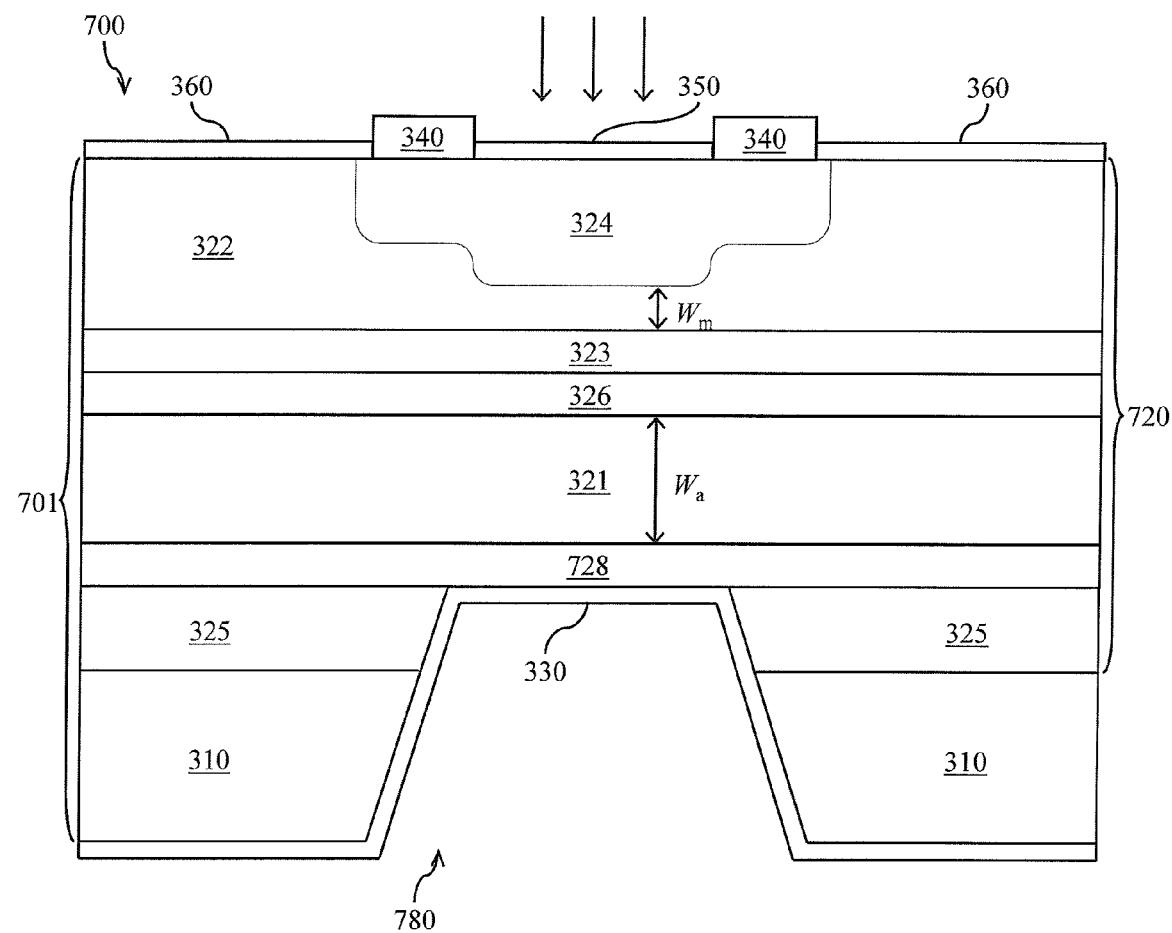
FIG. 7 is a schematic illustration of a cross-section of a fifth embodiment of a front-illuminated APD according to the present invention.

With reference to FIG. 7, a fifth embodiment of a front-illuminated APD 700 includes an APD body 701, which has a layer structure similar to that of the APD body 301 of the front-illuminated APD 300. The APD body 701 includes the substrate 310 of the front-illuminated APD 300, as well as a layer stack 720. In addition, the APD body 701 includes a back trench 780, for shortening an optical path between the absorption layer 321 and a back surface of the APD body 701. Advantageously, the back surface of the APD body 701 is mechanically and chemically polished to increase a reflectance of the back surface of the APD body 701 at the absorption wavelength band.

The layer stack 720 comprises the absorption layer 321, the multiplication layer 322, the field-control layer 323, the passivation region 324, the buffer layer 325, and the grading layer 326 of the front-illuminated APD 300. In some instances, the multiplication layer 322 includes a guard ring (not illustrated in FIG. 9). The layer stack 720 further comprises an etch-stop layer 728, for preventing etching of a portion of the layer stack 720.

The layer stack 720 is disposed on the front surface of the substrate 310. Within the layer stack 720, the buffer layer 325 is disposed at a back of the layer stack 720, and the etch-stop layer 728 is disposed on the front surface of the buffer layer 325. The absorption layer 321 is disposed on a front surface of the etch-stop layer 728, the grading layer 326 is disposed on the front surface of the absorption layer 321, and the field-control layer 323 is disposed on the front surface of the grading layer 326. The multiplication layer 322 is disposed on the front surface of the field-control layer 323 at a front of the layer stack 720, and the diffusion region 324 is disposed in the front portion of the multiplication layer 322.

The back trench 780 is disposed in the substrate 310 and in a back portion of the layer stack 720 behind the etch-stop layer 728, which does not comprise the absorption layer 321, the multiplication layer 322, nor the field-control layer 323. In the illustrated embodiment, the back portion of the layer stack 720 consists of the buffer layer 325. Thus, the back surface of the APD body 701 includes a reflector region of a back surface of the etch-stop layer and a back surface of the substrate 310. The reflector region of the back surface of the etch-stop layer 728 is chemically polished, and the back surface of the substrate 310 is mechanically polished. The reflector region of the back surface of the etch-stop layer 728 is disposed behind the multiplication region, in close proximity to the absorption layer 321. Preferably, the back trench 780 is shaped as a truncated cone, and the reflector region of the back surface of the etch-stop layer 728 is circular.

In addition, the front-illuminated APD 700 includes the reflector 330, the front contact 340, the antireflection layer 350, and the passivation layer 360 of the front-illuminated APD 300.

The reflector 330 is disposed on the back surface of the APD body 701. Preferably, the reflector 330 is disposed on the entire back surface of the APD body 701, including the reflector region of the back surface of the etch-stop layer 728 and the back surface of the substrate 310. Advantageously, the back trench 780 allows the reflector 330 to be disposed in close proximity to the absorption layer 321. Thus, the back trench 780 is also for shortening an optical path between the absorption layer 321 and the reflector 330.

The portion of incident light that is not absorbed in a first pass through the absorption layer 321 must only pass through a portion of the layer stack 720, which consists of the etch-stop layer 728 in the illustrated embodiment, before reaching the reflector 330, where it is reflected back for a second pass through the absorption layer 321. The shortened optical path between the absorption layer 321 and the reflector 330 provided by this configuration reduces optical loss and increases an intrinsic responsivity of the front-illuminated APD 700.

For comparison, in a front-illuminated APD without the back trench 780, such as the front-illuminated APD 300, the substrate 310, typically, has a thickness of about 100 μm. In optical communication applications, the incident light beam is not usually collimated and, typically, has a divergence angle of greater than 5°. Thus, after passing back and forth through the substrate 310, the diameter of the incident light beam will increase by about 35 μm. As the front-illuminated APD 300, typically, has an active region of about 20 to 50 μm in diameter, only about 50% of the light reflected by the reflector 330 is able to be utilized. The front-illuminated APD 700, on the other hand, is able to utilize almost 100% of the incident light beam.

The front contact 340 is disposed on an annular contact region of a front surface of the APD body 701, such that an inner circumference of the front contact 340 defines a circular window region of the front surface of the APD body 701. The antireflection layer 350 is disposed on the window region of the front surface of the APD body 701, and the passivation layer 360 is disposed on the front surface of the APD body 701 with exception of the contact region and the window region.

In the front-illuminated APD 700, the etch-stop layer 728 is of extrinsic semiconductor material of the first conductivity type, which is, preferably, lattice-matched to the semiconductor material of the substrate 310. Preferably, the etch-stop layer 728 is of an n-type or a p-type III-V semiconductor compound. In a preferred embodiment, the etch-stop layer 728 is of n-type InGaAsP, lattice-matched to InP.

Figure 8:
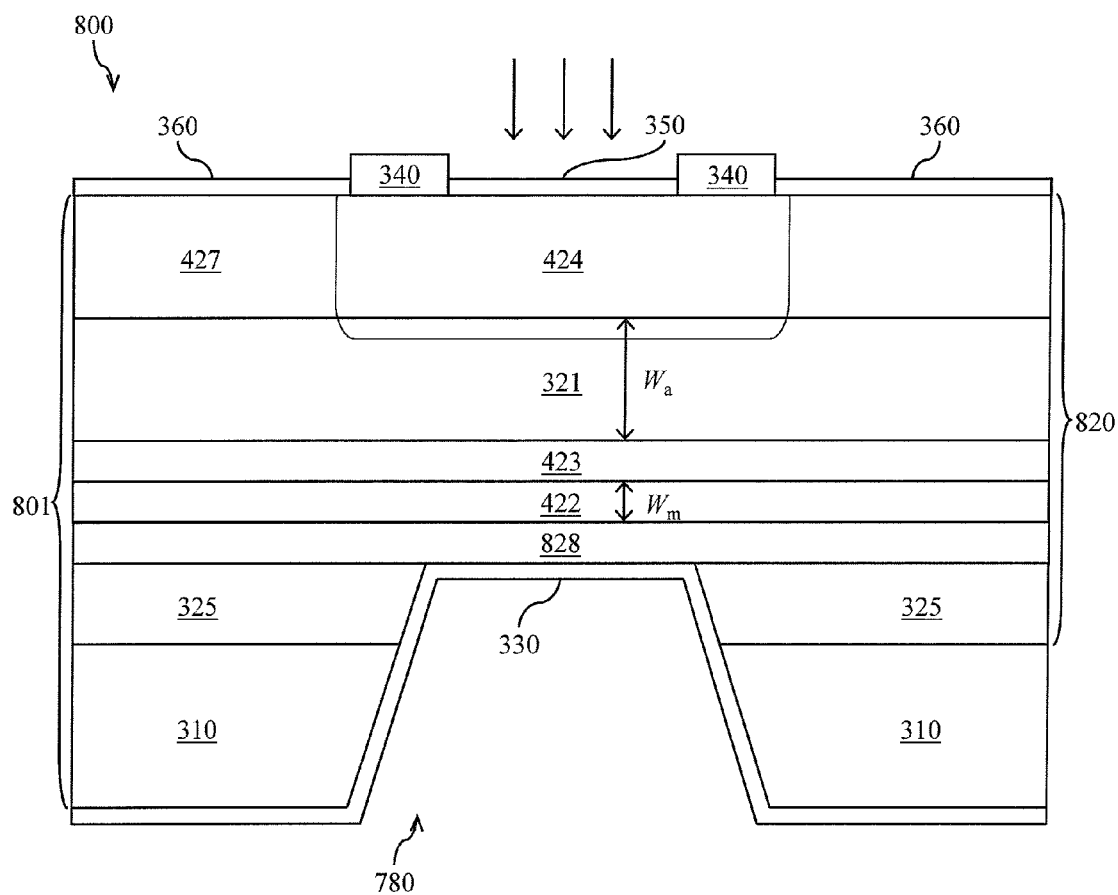
FIG. 8 is a schematic illustration of a cross-section of a sixth embodiment of a front-illuminated APD according to the present invention.

With reference to FIG. 8, a sixth embodiment of a front-illuminated APD 800 includes an APD body 801, which has a layer structure similar to that of the APD body 401 of the front-illuminated APD 400. The APD body 801 includes the substrate 310 of the front-illuminated APD 300 and the back trench 780 of the front-illuminated APD 700, as well as a layer stack 820. Advantageously, a back surface of the APD body 801 is mechanically and chemically polished to increase a reflectance of the back surface of the APD body 801 at the absorption wavelength band.

The layer stack 820 comprises the absorption layer 321 and the buffer layer 325 of the front-illuminated APD 300, as well as the multiplication layer 422, the field-control layer 423, the window layer 427, and the diffusion region 424 of the front-illuminated APD 400. The layer stack 820 further comprises an etch-stop layer 828, for preventing etching of a portion of the layer stack 820.

The layer stack 820 is disposed on the front surface of the substrate 310. Within the layer stack 820, the buffer layer 325 is disposed at a back of the layer stack 820, and the etch-stop layer 828 is disposed on the front surface of the buffer layer 325. The multiplication layer 422 is disposed on a front surface of the etch-stop layer 828, the field-control layer 423 is disposed on the front surface of the multiplication layer 422, and the absorption layer 321 is disposed on the front surface of the field-control layer 423. The window layer 427 is disposed on the front surface of the absorption layer 321 at a front of the layer stack 820, and the diffusion region 424 is disposed in the window layer 427 and in the front portion of the absorption layer 321.

The back trench 780 is disposed in the substrate 310 and in a back portion of the layer stack 820 behind the etch-stop layer 828, which does not comprise the absorption layer 321, the multiplication layer 422, nor the field-control layer 423. In the illustrated embodiment, the back portion of the layer stack 820 consists of the buffer layer 325. Thus, the back surface of the APD body 801 includes a reflector region of a back surface of the etch-stop layer 828 and the back surface of the substrate 310. The reflector region of the back surface of the etch-stop layer 828 is chemically polished, and the back surface of the substrate 310 is mechanically polished. The reflector region of the back surface of the etch-stop layer 828 is disposed behind the multiplication region, in close proximity to the absorption layer 321. Preferably, the reflector region of the back surface of the etch-stop layer 828 is circular.

In addition, the front-illuminated APD 800 includes the reflector 330, the front contact 340, the antireflection layer 350, and the passivation layer 360 of the front-illuminated APD 300.

The reflector 330 is disposed on the back surface of the APD body 801. Preferably, the reflector 330 is disposed on the entire back surface of the APD body 801, including the reflector region of the back surface of the etch-stop layer 828 and the back surface of the substrate 310.

The front contact 340 is disposed on an annular contact region of a front surface of the APD body 801, such that an inner circumference of the front contact 340 defines a circular window region of the front surface of the APD body 801. The antireflection layer 350 is disposed on the window region of the front surface of the APD body 801, and the passivation layer 360 is disposed on the front surface of the APD body 801 with exception of the contact region and the window region.

In the front-illuminated APD 800, the etch-stop layer 828 is of extrinsic semiconductor material of the first conductivity type, which is, preferably, lattice-matched to the semiconductor material of the substrate 310. Preferably, the etch-stop layer 828 is of an n-type or a p-type III-V semiconductor compound. In a preferred embodiment, the etch-stop layer 828 is of n-type InAlAs, lattice-matched to InP.

Figure 9:
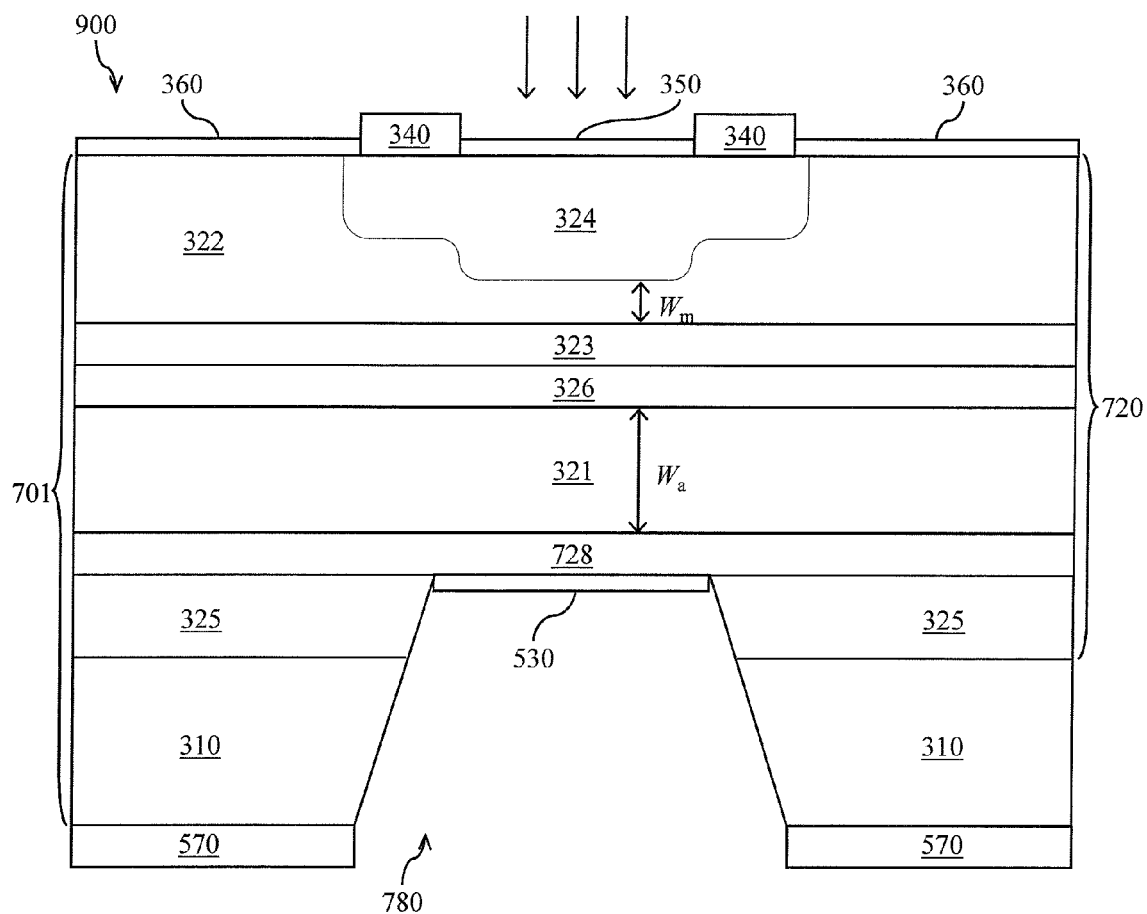
FIG. 9 is a schematic illustration of a cross-section of a seventh embodiment of a front-illuminated APD according to the present invention.

With reference to FIG. 9, a seventh embodiment of a front-illuminated APD 900 includes the APD body 701 of the front-illuminated APD 700, the reflector 530 and the back contact 570 of the front-illuminated APD 500, and the front contact 340, the antireflection layer 350, and the passivation layer 360 of the front-illuminated APD 300.

As mentioned heretofore, the back surface of the APD body 701 includes the reflector region of the back surface of the etch-stop layer 728 and the back surface of the substrate 310. The back contact 570 is disposed on an annular contact region of the back surface of the substrate 310, and the reflector 530 is disposed on the reflector region of the back surface of the etch-stop layer 728. Preferably, the reflector 530 is disposed only on the reflector region of the back surface of the etch-stop layer 728.

Figure 10:
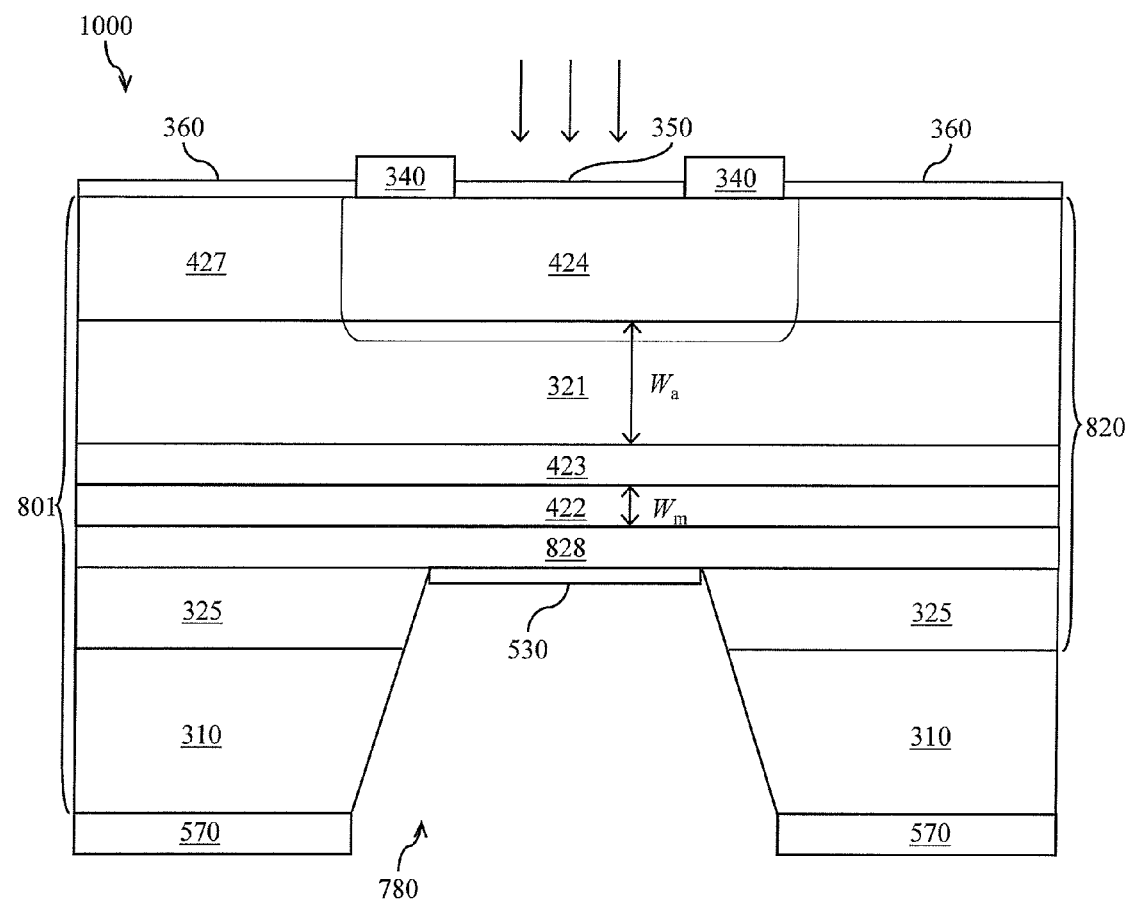
FIG. 10 is a schematic illustration of a cross-section of an eighth embodiment of a front-illuminated APD according to the present invention.

With reference to FIG. 10, an eighth embodiment of a front-illuminated APD 1000 includes the APD body 801 of the front-illuminated APD 800, the reflector 530 and the back contact 570 of the front-illuminated APD 500, and the front contact 340, the antireflection layer 350, and the passivation layer 360 of the front-illuminated APD 300.

As mentioned heretofore, the back surface of the APD body 801 includes the reflector region of the back surface of the etch-stop layer 828 and the back surface of the substrate 310. The back contact 570 is disposed on the annular contact region of the back surface of the substrate 310, and the reflector 530 is disposed on the reflector region of the back surface of the etch-stop layer 828. Preferably, the reflector 530 is disposed only on the reflector region of the back surface of the etch-stop layer 828.

Figure 11:
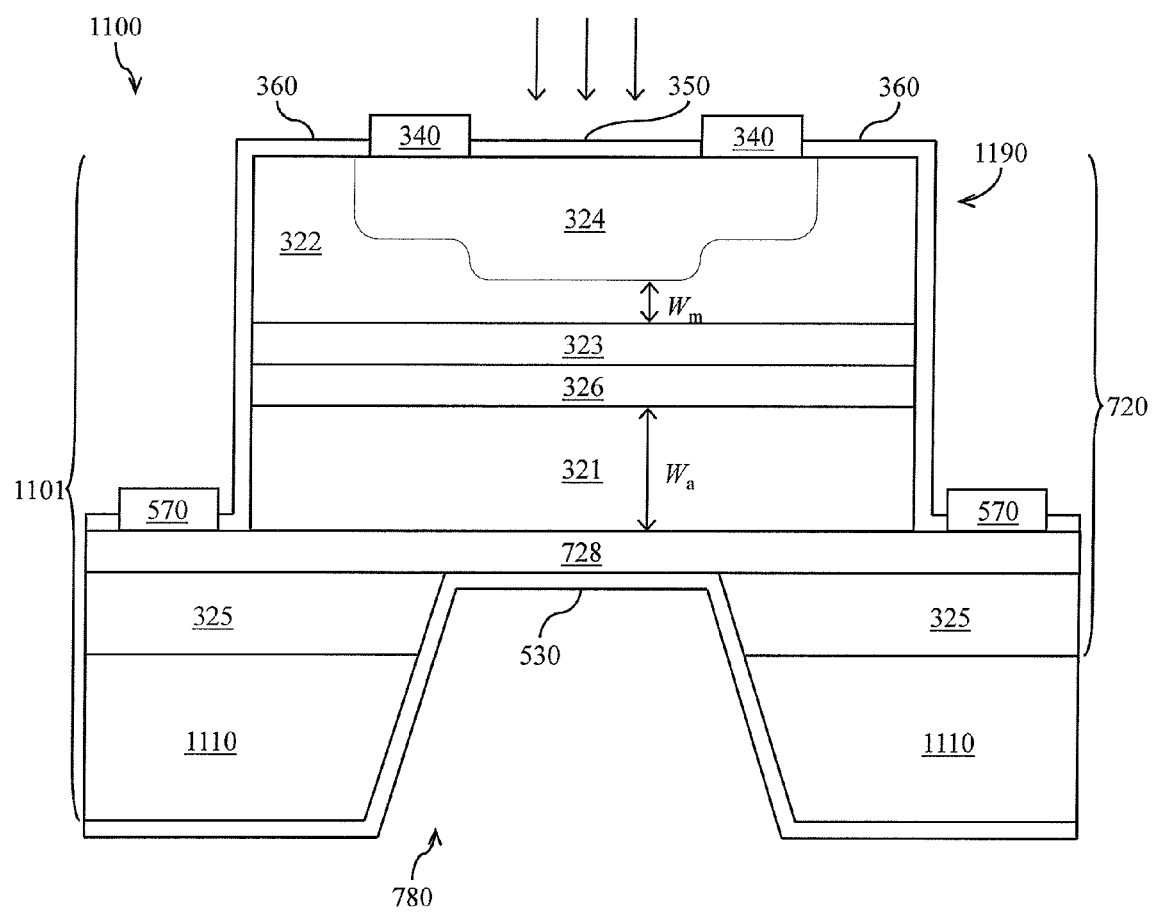
FIG. 11 is a schematic illustration of a cross-section of a ninth embodiment of a front-illuminated APD according to the present invention.

With reference to FIG. 11, a ninth embodiment of a front-illuminated APD 1100 includes an APD body 1101 of semiconductor material, which has a layer structure similar to that of the APD body 701 of the front-illuminated APD 700. The APD body 1101 includes a substrate 1110, as well as the layer stack 720 and the back trench 780 of the front-illuminated APD 700. In addition, the APD body 1101 includes a front mesa 1190, for allowing front contacting. Advantageously, a back surface of the APD body 1101 is mechanically and chemically polished to increase a reflectance of the back surface of the APD body 1101 at the absorption wavelength band.

The layer stack 720 is disposed on a front surface of the substrate 1110. The back trench 780 is disposed in the substrate 1110 and in the back portion of the layer stack 720 behind the etch-stop layer 728, which does not comprise the absorption layer 321, the multiplication layer 322, nor the field-control layer 323. Thus, the back surface of the APD body 1101 includes the reflector region of the back surface of the etch-stop layer 728 and a back surface of the substrate 1110. The reflector region of the back surface of the etch-stop layer 728 is chemically polished, and the back surface of the substrate 1110 is mechanically polished.

The front mesa 1190 includes a front portion of the layer stack 720 in front of the etch-stop layer 728, which comprises the absorption layer 321, the multiplication layer 322, and the field-control layer 323. In the illustrated embodiment, the front portion of the layer stack 720 consists of the absorption layer 321, the grading layer 326, the field-control layer 323, the multiplication layer 322, and the diffusion region 324. Thus, a front surface of the APD body 1101 includes a contact region of the front surface of the etch-stop layer 728, as well as a front surface and a side surface of the front mesa 1190. Preferably, the front mesa 1190 is cylindrical, and the contact region of the front surface of the etch-stop layer 728 is annular.

In addition, the front-illuminated APD 1100 includes the reflector 530 and the back contact 570 of the front-illuminated APD 500, and the front contact 340, the antireflection layer 350, and the passivation layer 360 of the front-illuminated APD 300.

The reflector 530 is disposed on the back surface of the APD body 1101. Preferably, the reflector 530 is disposed on the entire back surface of the APD body 1101, including the reflector region of the back surface of the etch-stop layer 728 and the back surface of the substrate 1110. The back contact 570 is disposed on the contact region of the front surface of the etch-stop layer 728.

The front contact 340 is disposed on an annular contact region of the front surface of the front mesa 1190, such that an inner circumference of the front contact 340 defines a circular window region of the front surface of the front mesa 1190. The antireflection layer 350 is disposed on the window region of the front surface of the front mesa 1190, and the passivation layer 360 is disposed on the front surface of APD body 1101 with exception of the contact region and the window region of the front surface of the front mesa 1190 and the contact region of the front surface of the etch-stop layer 728.

In the front-illuminated APD 1100, the substrate 1110 is of semi-insulating semiconductor material. Preferably, the substrate 1110 is of a semi-insulating III-V semiconductor compound. A semi-insulating III-V semiconductor compound, typically, includes a transition-metal dopant, such as iron or ruthenium. In a preferred embodiment, the substrate 1110 is of semi-insulating InP.

Figure 12:
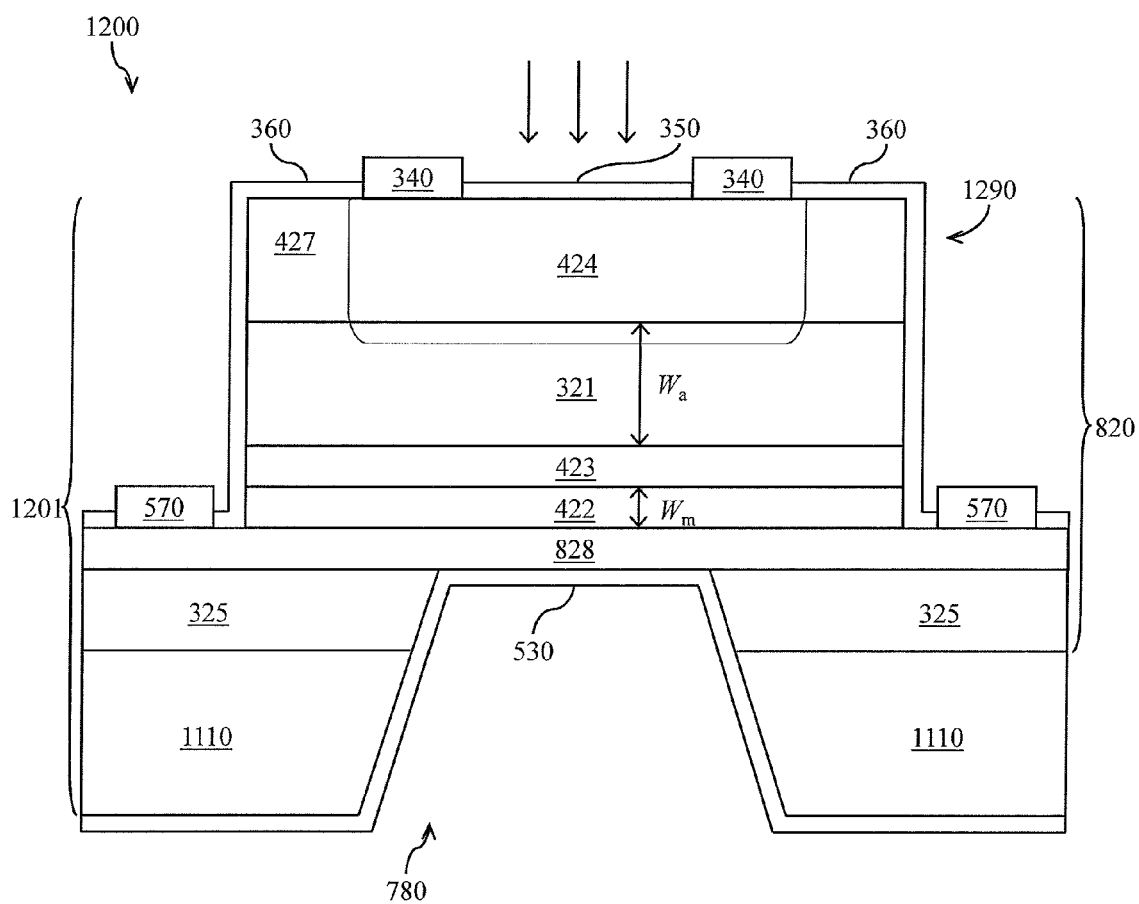
FIG. 12 is a schematic illustration of a cross-section of a tenth embodiment of a front-illuminated APD according to the present invention.

With reference to FIG. 12, a tenth embodiment of a front-illuminated APD 1200 includes an APD body 1201 of semiconductor material, which has a layer structure similar to that of the APD body 801 of the front-illuminated APD 800. The APD body 1201 includes the substrate 1110 of the front-illuminated APD 1100, the layer stack 820 of the front-illuminated APD 800, and the back trench 780 of the front-illuminated APD 700. In addition, the APD body 1201 includes a front mesa 1290, for allowing front contacting. Advantageously, a back surface of the APD body 1201 is mechanically and chemically polished to increase a reflectance of the back surface of the APD body 1201 at the absorption wavelength band.

The layer stack 820 is disposed on the front surface of the substrate 1110. The back trench 780 is disposed in the substrate 1110 and in the back portion of the layer stack 820 behind the etch-stop layer 828, which does not comprise the absorption layer 321, the multiplication layer 422, nor the field-control layer 423. Thus, the back surface of the APD body 1201 includes the reflector region of the back surface of the etch-stop layer 828 and the back surface of the substrate 1110. The reflector region of the back surface of the etch-stop layer 828 is chemically polished, and the back surface of the substrate 1110 is mechanically polished.

The front mesa 1290 includes a front portion of the layer stack 820 in front of the etch-stop layer 828, which comprises the absorption layer 321, the multiplication layer 422, and the field-control layer 423. In the illustrated embodiment, the front portion of the layer stack 820 consists of the multiplication layer 422, the field-control layer 423, the absorption layer 321, the window layer 427, and the diffusion region 424. Thus, a front surface of the APD body 1201 includes a contact region of the front surface of the etch-stop layer 828, as well as a front surface and a side surface of the front mesa 1290. Preferably, the front mesa 1290 is cylindrical, and the contact region of the front surface of the etch-stop layer 828 is annular.

In addition, the front-illuminated APD 1200 includes the reflector 530 and the back contact 570 of the front-illuminated APD 500, and the front contact 340, the antireflection layer 350, and the passivation layer 360 of the front-illuminated APD 300.

The reflector 530 is disposed on the back surface of the APD body 1201. Preferably, the reflector 530 is disposed on the entire back surface of the APD body 1201, including the reflector region of the back surface of the etch-stop layer 828 and the back surface of the substrate 1110. The back contact 570 is disposed on the contact region of the front surface of the etch-stop layer 828.

The front contact 340 is disposed on an annular contact region of the front surface of the front mesa 1290, such that an inner circumference of the front contact 340 defines a circular window region of the front surface of the front mesa 1290. The antireflection layer 350 is disposed on the window region of the front surface of the front mesa 1290, and the passivation layer 360 is disposed on the front surface of the APD body 1201 with exception of the contact region and the window region of the front surface of the front mesa 1290, and the contact region of the front surface of the etch-stop layer 828.

The present invention also provides methods of fabricating front-illuminated APDs with improved intrinsic responsivity. The advantageous features of the methods provided by the present invention will be described in the context of the fabrication of exemplary, preferred embodiments of a front-illuminated APD. However, those skilled in the art will appreciate that these advantageous features could also be applied to the fabrication of front-illuminated APDs having other configurations or layer structures. Furthermore, the advantageous features of the methods could also be applied in an order different from that described herein.

With reference to FIG. 3, a method of fabricating the front-illuminated APD 300 includes forming the APD body 301. The substrate 310 is provided, and the layer stack 320 is then epitaxially grown on the front surface of the substrate 310.

The buffer layer 325 is epitaxially grown at the back of the layer stack 320, and the absorption layer 321 is epitaxially grown on the front surface of the buffer layer 325. The grading layer 326 is epitaxially grown on the front surface of the absorption layer 321, and the field-control layer 323 is epitaxially grown on the front surface of the grading layer 326. The multiplication layer 322 is epitaxially grown on the front surface of the field-control layer 323 at the front of the layer stack 320. In some instances, a guard ring is formed in the multiplication layer 322 by dopant diffusion.

The passivation layer 360 is deposited on the front surface of the APD body 301 and is then etched to expose the window region and the contact region of the front surface of the APD body 301. The diffusion region 324 is formed in the front portion of the multiplication layer 322 by diffusing the dopant into the window region and the contact region of the front surface of the APD body 301. Preferably, the diffusion region 324 is formed by two dopant-diffusion steps to provide the diffusion region 324 with a shaped profile, as disclosed in U.S. Pat. No. 6,515,315. The antireflection layer 350 is deposited on the window region of the front surface of the APD body 301, and the front contact 340 is deposited on the contact region of the front surface of the APD body 301.

The back surface of the APD body 301 is mechanically and chemically polished, and the reflector 330 is deposited on the back surface of the APD body 301. Preferably, the reflector 330 is deposited on the entire back surface of the APD body 301.

With reference to FIG. 4, a method of fabricating the front-illuminated APD 400 includes forming the APD body 401. The substrate 310 is provided, and the layer stack 420 is then epitaxially grown on the front surface of the substrate 310.

The buffer layer 325 is epitaxially grown at the back of the layer stack 420, and the multiplication layer 422 is epitaxially grown on the front surface of the buffer layer 325. The field-control layer 423 is epitaxially grown on the front surface of the multiplication layer 422, and the absorption layer 321 is epitaxially grown on the front surface of the field-control layer 423. The window layer 427 is epitaxially grown on the front surface of the absorption layer 321 at the front of the layer stack 420.

The passivation layer 360 is deposited on the front surface of the APD body 401 and is then etched to expose the window region and the contact region of the front surface of the APD body 410. The diffusion region 424 is formed in the window layer 427 and in the front portion of the absorption layer 321 by diffusing the dopant into the window region and the contact region of the front surface of the APD body 401. The antireflection layer 350 is deposited on the window region of the front surface of the APD body 401, and the front contact 340 is deposited on the contact region of the front surface of the APD body 401.

The back surface of the APD body 401 is mechanically and chemically polished, and the reflector 330 is deposited on the back surface of the APD body 401. Preferably, the reflector 330 is deposited on the entire back surface of the APD body 401.

With reference to FIG. 5, a method of fabricating the front-illuminated APD 500 includes forming the APD body 301, the passivation layer 360, the antireflection layer 350, and the front contact 340, as described heretofore for the method of fabricating the front-illuminated APD 300.

The reflector 530 is deposited on the back surface of the APD body 301 and is then etched to expose the contact region of the back surface of the APD body 301. The back contact 570 is deposited on the contact region of the back surface of the APD body 301.

With reference to FIG. 6, a method of fabricating the front-illuminated APD 600 includes forming the APD body 401, the passivation layer 360, the antireflection layer 350, and the front contact 340, as described heretofore for the method of fabricating the front-illuminated APD 400.

The reflector 530 is deposited on the back surface of the APD body 401 and is then etched to expose the contact region of the back surface of the APD body 401. The back contact 570 is deposited on the contact region of the back surface of the APD body 401.

With reference to FIG. 7, a method of fabricating the front-illuminated APD 700 includes forming the APD body 701. The substrate 310 is provided, and the layer stack 720 is then epitaxially grown on the front surface of the substrate 310.

The buffer layer 325 is epitaxially grown at the back of the layer stack 720, and the etch-stop layer 728 is epitaxially grown on the front surface of the buffer layer 325. The absorption layer 321 is epitaxially grown on the front surface of the etch-stop layer 728, the grading layer 326 is epitaxially grown on the front surface of the absorption layer 321, and the field-control layer 323 is epitaxially grown on the front surface of the grading layer 326. The multiplication layer 322 is epitaxially grown on the front surface of the field-control layer 323 at the front of the layer stack 720. In some instances, a guard ring is formed in the multiplication layer 322 by dopant diffusion.

The passivation layer 360 is deposited on the front surface of the APD body 701 and is then etched to expose the window region and the contact region of the front surface of the APD body 701. The diffusion region 324 is formed in the front portion of the multiplication layer 322 by diffusing the dopant into the window region and the contact region of the front surface of the APD body 701. Preferably, the diffusion region 324 is formed by two dopant-diffusion steps to provide the diffusion region 324 with a shaped profile, as disclosed in U.S. Pat. No. 6,515,315. The antireflection layer 350 is deposited on the window region of the front surface of the APD body 701, and the front contact 340 is deposited on the contact region of the front surface of the APD body 701.

The substrate 310 and the back portion of the layer stack 720 behind the etch-stop layer 728 are etched to form the back trench 780 and to expose the reflector region of the back surface of the etch-stop layer 728. Thus, the back surface of the APD body 701 includes the reflector region of the back surface of the etch-stop layer 728 and the back surface of the substrate 310. The back surface of the APD body 701 is mechanically and chemically polished: the reflector region of the back surface of the etch-stop layer 728 is chemically polished by etching, and the back surface of the substrate 310 is mechanically polished. The reflector 330 is deposited on the back surface of the APD body 701. Preferably, the reflector 330 is deposited on the entire back surface of the APD body 701.

With reference to FIG. 8, a method of fabricating the front-illuminated APD 800 includes forming the APD body 801. The substrate 310 is provided, and the layer stack 820 is then epitaxially grown on the front surface of the substrate 310.

The buffer layer 325 is epitaxially grown at the back of the layer stack 820, and the etch-stop layer 828 is epitaxially grown on the front surface of the buffer layer 325. The multiplication layer 422 is epitaxially grown on the front surface of the etch-stop layer 828, the field-control layer 423 is epitaxially grown on the front surface of the multiplication layer 422, and the absorption layer 321 is epitaxially grown on the front surface of the field-control layer 423. The window layer 427 is epitaxially grown on the front surface of the absorption layer 321 at the front of the layer stack 820.

The passivation layer 360 is deposited on the front surface of the APD body 801 and is then etched to expose the window region and the contact region of the front surface of the APD body 801. The diffusion region 424 is formed in the window layer 427 and in the front portion of the absorption layer 321 by diffusing the dopant into the window region and the contact region of the front surface of the APD body 801. The antireflection layer 350 is deposited on the window region of the front surface of the APD body 801, and the front contact 340 is deposited on the contact region of the front surface of the APD body 801.

The substrate 310 and the back portion of the layer stack 820 behind the etch-stop layer 828 are etched to form the back trench 780 and to expose the reflector region of the back surface of the etch-stop layer 828. Thus, the back surface of the APD body 801 includes the reflector region of the back surface of the etch-stop layer 828 and the back surface of the substrate 310. The back surface of the APD body 801 is mechanically and chemically polished: the reflector region of the back surface of the etch-stop layer 828 is chemically polished by etching, and the back surface of the substrate 310 is mechanically polished. The reflector 330 is deposited on the back surface of the APD body 801. Preferably, the reflector 330 is deposited on the entire back surface of the APD body 801.

With reference to FIG. 9, a method of fabricating the front-illuminated APD 900 includes forming the APD body 701, the passivation layer 360, the antireflection layer 350, and the front contact 340, as described heretofore for the method of fabricating the front-illuminated APD 700.

As mentioned heretofore, the back surface of the APD body 701 includes the reflector region of the back surface of the etch-stop layer 728 and the back surface of the substrate 310. The reflector 530 is deposited on the reflector region of the back surface of the etch-stop layer 728, and the back contact 570 is deposited on the contact region of the back surface of the substrate 310. Preferably, the reflector 530 is deposited only on the reflector region of the back surface of the etch-stop layer 728.

With reference to FIG. 10, a method of fabricating the front-illuminated APD 1000 includes forming the APD body 801, the passivation layer 360, the antireflection layer 350, and the front contact 340, as described heretofore for the method of fabricating the front-illuminated APD 800.

As mentioned heretofore, the back surface of the APD body 801 includes the reflector region of the back surface of the etch-stop layer 828 and the back surface of the substrate 310. The reflector 530 is deposited on the reflector region of the back surface of the etch-stop layer 828, and the back contact 570 is deposited on the contact region of the back surface of the substrate 310. Preferably, the reflector 530 is deposited only on the reflector region of the back surface of the etch-stop layer 828.

With reference to FIG. 11, a method of fabricating the front-illuminated APD 1100 includes forming the APD body 1101. The substrate 1110 is provided, and the layer stack 720 is then epitaxially grown on the front surface of the substrate 1110, as described heretofore for the method of fabricating the front-illuminated APD 700.

The front portion of the layer stack 720 in front of the etch-stop layer 728 is etched to form the front mesa 1190 and to expose the contact region of the front surface of the etch-stop layer 728. Thus, the front surface of the APD body 1101 includes the contact region of the front surface of the etch-stop layer 728, as well as the front surface and the side surface of the front mesa 1190.

The passivation layer 360 is deposited on the front surface of the APD body 1101 and is then etched to expose the window region and the contact region of the front surface of the front mesa 1190, and the contact region of the front surface of the etch-stop layer 728. The diffusion region 324 is formed in the front portion of the multiplication layer 322 by diffusing the dopant into the window region and the contact region of the front surface of the front mesa 1190. Preferably, the diffusion region 324 is formed by two dopant-diffusion steps to provide the diffusion region 324 with a shaped profile, as disclosed in U.S. Pat. No. 6,515,315. The antireflection layer 350 is deposited on the window region of the front surface of the front mesa 1190, the front contact 340 is deposited on the contact region of the front surface of the front mesa 1190, and the back contact 570 is deposited on the contact region of the front surface of the etch-stop layer 728.

The substrate 1110 and the back portion of the layer stack 720 behind the etch-stop layer 728 are etched to form the back trench 780 and to expose the reflector region of the back surface of the etch-stop layer 728. Thus, the back surface of the APD body 1101 includes the reflector region of the back surface of the etch-stop layer 728 and the back surface of the substrate 1110. The back surface of the APD body 1101 is mechanically and chemically polished: the reflector region of the back surface of the etch-stop layer 728 is chemically polished by etching, and the back surface of the substrate 1110 is mechanically polished. The reflector 530 is deposited on the back surface of the APD body 1101. Preferably, the reflector 530 is deposited on the entire back surface of the APD body 1101.

With reference to FIG. 12, a method of fabricating the front-illuminated APD 1200 includes forming the APD body 1201. The substrate 1110 is provided, and the layer stack 820 is then epitaxially grown on the front surface of the substrate 1110, as described heretofore for the method of fabricating the front-illuminated APD 800.

The front portion of the layer stack 820 in front of the etch-stop layer 828 is etched to form the front mesa 1290 and to expose the contact region of the front surface of the etch-stop layer 828. Thus, the front surface of the APD body 1201 includes the contact region of the front surface of the etch-stop layer 828, as well as the front surface and the side surface of the front mesa 1290.

The passivation layer 360 is deposited on the front surface of the APD body 1201 and is then etched to expose the window region and the contact region of the front surface of the front mesa 1290, and the contact region of the front surface of the etch-stop layer 828. The diffusion region 424 is formed in the window layer 427 and in the front portion of the absorption layer 321 by diffusing the dopant into the window region and the contact region of the front surface of the front mesa 1290. The antireflection layer 350 is deposited on the window region of the front surface of the front mesa 1290, the front contact 340 is deposited on the contact region of the front surface of the front mesa 1290, and the back contact 570 is deposited on the contact region of the front surface of the etch-stop layer 828.

The substrate 1110 and the back portion of the layer stack 820 behind the etch-stop layer 828 are etched to form the back trench 780 and to expose the reflector region of the back surface of the etch-stop layer 828. Thus, the back surface of the APD body 1201 includes the reflector region of the back surface of the etch-stop layer 828 and the back surface of the substrate 1110. The back surface of the APD body 1201 is mechanically and chemically polished: the reflector region of the back surface of the etch-stop layer 828 is chemically polished by etching, and the back surface of the substrate 1110 is mechanically polished. The reflector 530 is deposited on the back surface of the APD body 1201. Preferably, the reflector 530 is deposited on the entire back surface of the APD body 1201.

The methods of fabricating the APDs 300 to 1200 described heretofore are carried out using conventional techniques, which will not be described in detail herein, as they are well-known to those skilled in the art. The epitaxial growth steps are, preferably, performed by metal-organic chemical vapor deposition (MOCVD) or by molecular beam epitaxy (MBE). The etching steps are, preferably, performed by wet or dry chemical etching, in a photolithography process. The deposition steps are, preferably, performed by physical vapor deposition (PVD) or by chemical vapor deposition (CVD), using a photolithography lift-off process for patterning, as necessary. The polishing steps are performed by mechanical lapping, followed by chemical polishing.

Of course, numerous other embodiments may be envisaged without departing from the spirit and scope of the invention.

We claim:

1. A front-illuminated avalanche photodiode (APD) comprising:
    an APD body of semiconductor material, including:
        a substrate; and
        a layer stack, disposed on a front surface of the substrate, comprising:
            an absorption layer for absorbing light at an absorption wavelength band to generate a photocurrent;
            a multiplication layer, including a multiplication region, for multiplying the photocurrent through avalanche multiplication; and
            a field-control layer for controlling electric fields in the absorption layer and the multiplication layer;
    wherein a back surface of the APD body is mechanically and chemically polished; and
    a reflector having a reflectance of greater than 90% at the absorption wavelength band, for reflecting light at the absorption wavelength band toward the absorption layer, disposed on the back surface of the APD body.

2. The front-illuminated APD of claim 1, wherein the layer stack further comprises a buffer layer, for accommodating lattice mismatch between the substrate and the layer stack, and a grading layer, for facilitating current flow between the absorption layer and the multiplication layer; and wherein the multiplication layer further includes a diffusion region, for defining the multiplication region and for providing a p-n junction.

3. The front-illuminated APD of claim 1, wherein the layer stack further includes a buffer layer, for accommodating lattice mismatch between the substrate and the layer stack, and a window layer, for transmitting light at the absorption wavelength band to the absorption layer; and wherein the window layer includes a diffusion region, for defining the multiplication region and for providing a p-n junction.

4. The front-illuminated APD of claim 1, wherein the reflector is disposed on the entire back surface of the APD body.

5. The front-illuminated APD of claim 1, further comprising an annular back contact of metallic material, for passing current to or from the front-illuminated APD, disposed on an annular contact region of the back surface of the APD body; wherein an inner circumference of the back contact defines a circular reflector region of the back surface of the APD body; and wherein the reflector is disposed on the reflector region of the back surface of the APD body.

6. The front-illuminated APD of claim 5, wherein the reflector is disposed only on the reflector region of the back surface of the APD body.

7. The front-illuminated APD of claim 1, wherein the APD body further includes a back trench, for shortening an optical path between the absorption layer and the reflector, disposed in the substrate and in a back portion of the layer stack not comprising the absorption layer, the multiplication layer, nor the field-control layer.

8. The front-illuminated APD of claim 1, wherein the APD body further includes a front mesa, for allowing front contacting, including a front portion of the layer stack comprising the absorption layer, the multiplication layer, and the field-control layer.

9. The front-illuminated APD of claim 1, wherein the layer stack further comprises an etch-stop layer, for preventing etching of a portion of the layer stack.

10. The front-illuminated APD of claim 9, wherein the APD body further includes a back trench, for shortening an optical path between the absorption layer and the reflector, disposed in the substrate and in a back portion of the layer stack behind the etch-stop layer, such that the back surface of the APD body includes a reflector region of a back surface of the etch-stop layer.

11. The front-illuminated APD of claim 9, wherein the APD body further includes a front mesa, for allowing front contacting, including a front portion of the layer stack in front of the etch-stop layer, such that a front surface of the APD body includes a contact region of a front surface of the etch-stop layer; further comprising a back contact of metallic material, for passing current to or from the front-illuminated APD, disposed on the contact region of the front surface of the etch-stop layer.

12. The front-illuminated APD of claim 1, wherein the absorption layer has a thickness of less than 1 μm.

13. The front-illuminated APD of claim 1, wherein the reflector includes a layer of a noble metal or a layer of an alloy of a noble metal.

14. The front-illuminated APD of claim 13, wherein the reflector further includes one or more layers of dielectric compounds.

15. The front-illuminated APD of claim 1, wherein the reflector includes one or more layers of dielectric compounds.

16. A method of fabricating a front-illuminated APD, comprising:
    i) forming an APD body of semiconductor material, including:
        a) providing a substrate; and
        b) epitaxially growing a layer stack on a front surface of the substrate, comprising:
            epitaxially growing an absorption layer, for absorbing light at an absorption wavelength band to generate a photocurrent;
            epitaxially growing a multiplication layer, including a multiplication region, for multiplying the photocurrent through avalanche multiplication; and
            epitaxially growing a field-control layer for controlling electric fields in the absorption layer and the multiplication layer;
    ii) mechanically and chemically polishing a back surface of the APD body; and
    iii) depositing a reflector having a reflectance of greater than 90% at the absorption wavelength band on the back surface of the APD body.

17. The method of claim 16, wherein ib) further comprises:
    epitaxially growing a buffer layer, for accommodating lattice mismatch between the substrate and the layer stack;
    epitaxially growing a grading layer, for facilitating current flow between the absorption layer and the multiplication layer; and diffusing a dopant into the multiplication layer to form a diffusion region, for defining the multiplication region and for providing a p-n junction, in a front portion of the multiplication layer.

18. The method of claim 16, wherein ib) further comprises:
epitaxially growing a buffer layer, for accommodating lattice mismatch between the substrate and the layer stack;
epitaxially growing a window layer, for transmitting light at the absorption wavelength band to the absorption layer; and
diffusing a dopant into the window layer to form a diffusion region, for defining the multiplication region and for providing a p-n junction, in the window layer.

19. The method of claim 16, wherein iii) includes depositing the reflector on the entire back surface of the APD body.

20. The method of claim 16, further comprising:
etching the reflector to expose an annular contact region of the back surface of the APD body; and
depositing an annular back contact of metallic material, for passing current to or from the front-illuminated APD, on the contact region of the back surface of the APD body.

21. The method of claim 16, wherein i) further includes etching the substrate and a back portion of the layer stack not comprising the absorption layer, the multiplication layer, nor the field-control layer to form a back trench, for shortening an optical path between the absorption layer and the reflector.

22. The method of claim 16, wherein i) further includes etching a front portion of the layer stack comprising the absorption layer, the multiplication layer, and the field-control layer to form a front mesa, for allowing front contacting.

23. The method of claim 16, wherein ib) further comprises epitaxially growing an etch-stop layer, for preventing etching of a portion of the layer stack.

24. The method of claim 23, wherein i) further includes etching the substrate and a back portion of the layer stack behind the etch-stop layer to form a back trench, for shortening an optical path between the absorption layer and the reflector, and to expose a reflector region of a back surface of the etch-stop layer, such that the back surface of the APD body includes the reflector region of the back surface of the etch-stop layer.

25. The method of claim 23, wherein i) further includes etching a front portion of the layer stack in front of the etch-stop layer to form a front mesa, for allowing front contacting, and to expose a contact region of a front surface the etch-stop layer, such that a front surface of the APD body includes the contact region of the front surface of the etch-stop layer; further comprising depositing an annular back contact on the contact region of the front surface of the etch-stop layer.

* * * * *